US012610548B2

(12) United States Patent
Wang et al.

(10) Patent No.: US 12,610,548 B2
(45) Date of Patent: Apr. 21, 2026

(54) THREE-DIMENSIONAL MEMORY DEVICE AND FABRICATION METHOD

(71) Applicant: Yangtze Memory Technologies Co., Ltd., Wuhan (CN)

(72) Inventors: Jiandong Wang, Wuhan (CN); Wenbin Sun, Wuhan (CN); Siliu Zhang, Wuhan (CN); Xiaofen Zheng, Wuhan (CN); Yuping Xia, Wuhan (CN); Yonggang Yang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 660 days.

(21) Appl. No.: 18/089,895

(22) Filed: Dec. 28, 2022

(65) Prior Publication Data

US 2024/0206163 A1     Jun. 20, 2024

(30) Foreign Application Priority Data

Dec. 20, 2022   (CN) .......................... 202211642524.1

(51) Int. Cl.
*H10B 41/27*      (2023.01)
*H10B 43/27*      (2023.01)
*H10B 80/00*      (2023.01)

(52) U.S. Cl.
CPC ............. *H10B 43/27* (2023.02); *H10B 41/27* (2023.02); *H10B 80/00* (2023.02)

(58) Field of Classification Search
CPC ........ H10B 41/27; H10B 43/10; H10B 43/27; H10B 80/00
See application file for complete search history.

(56) References Cited

U.S. PATENT DOCUMENTS

| | | | |
|---|---|---|---|
| 9,397,043 B1 * | 7/2016 | Minemura | ............. H10B 43/27 |
| 11,495,541 B2 * | 11/2022 | Lim | ...................... H01L 23/535 |
| 11,515,325 B2 * | 11/2022 | Lim | ...................... H10B 43/10 |
| 2020/0066742 A1 * | 2/2020 | Kim | ...................... H10B 43/50 |
| 2021/0043504 A1 * | 2/2021 | Chandolu | ............. H10B 43/27 |

* cited by examiner

*Primary Examiner* — Jaehwan Oh
(74) *Attorney, Agent, or Firm* — Anova Law Group, PLLC

(57) ABSTRACT

A 3D memory device includes a conductor/insulator stack containing a conductive layer and a dielectric layer alternatingly stacked, a channel hole structure in the conductor/insulator stack, and a gate line slit (GLS) structure. The GLS structure includes a main section and an end section. The main section extends along a first direction and has a first width measured along a second direction that is perpendicular to the first direction. The end section has a second width measured along the second direction. The second width is larger than the first width.

20 Claims, 18 Drawing Sheets

190

100

180

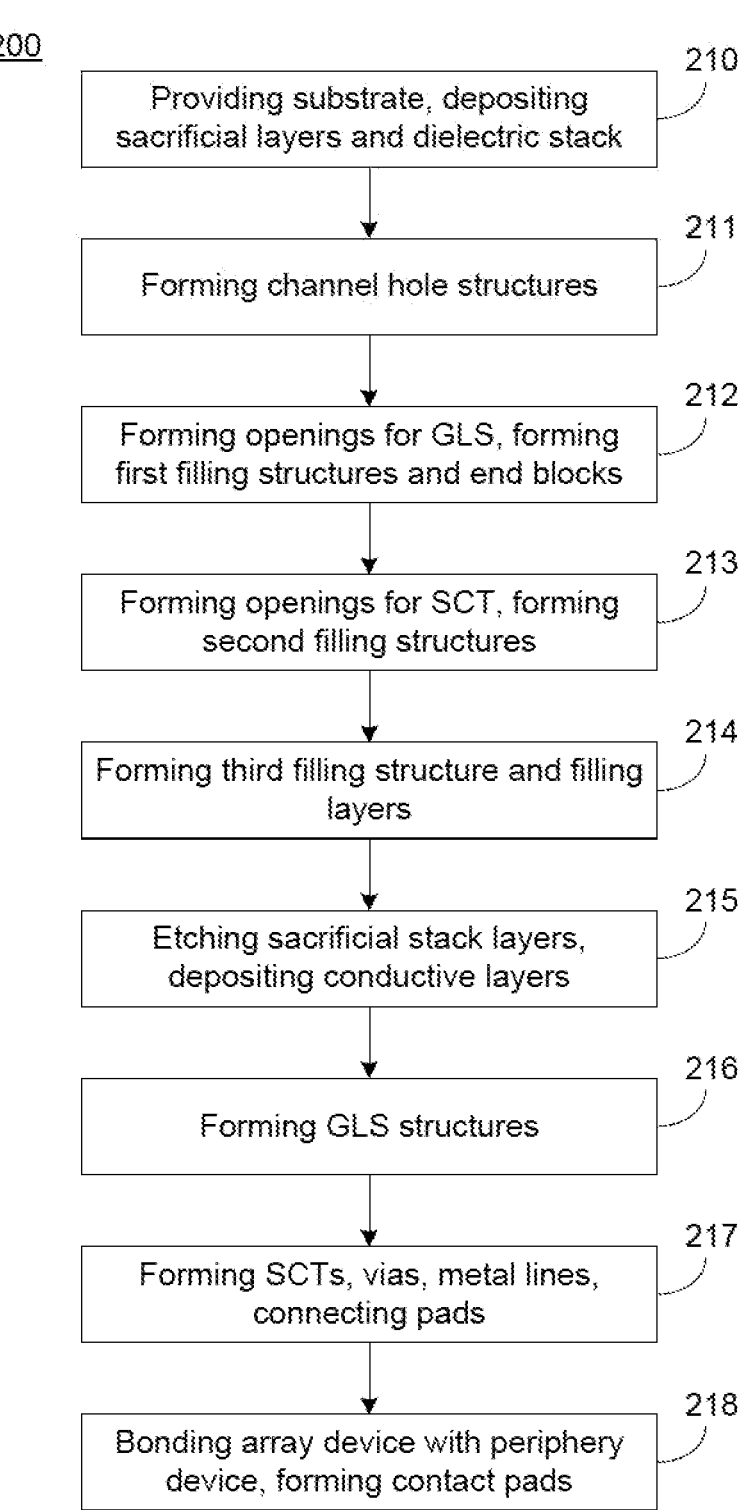

200

210 — Providing substrate, depositing sacrificial layers and dielectric stack

211 — Forming channel hole structures

212 — Forming openings for GLS, forming first filling structures and end blocks

213 — Forming openings for SCT, forming second filling structures

214 — Forming third filling structure and filling layers

215 — Etching sacrificial stack layers, depositing conductive layers

216 — Forming GLS structures

217 — Forming SCTs, vias, metal lines, connecting pads

218 — Bonding array device with periphery device, forming contact pads

THREE-DIMENSIONAL MEMORY DEVICE AND FABRICATION METHOD

CROSS-REFERENCE TO RELATED APPLICATION

This application claims the priority of Chinese Patent Application No. 202211642524.1, filed on Dec. 20, 2022, the content of which is incorporated herein by reference in its entirety.

FIELD OF THE TECHNOLOGY

This application relates to the field of semiconductor technology and, specifically, to a three-dimensional (3D) memory device and fabrication method for improved yield and reliability.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

SUMMARY

In one aspect of the present disclosure, a 3D memory device includes a conductor/insulator stack containing a conductive layer and a dielectric layer alternatingly stacked, a channel hole structure in a region of memory cells in the conductor/insulator stack, and a first gate line slit (GLS) structure adjacent to the region of memory cells. The first GLS structure includes a first main section and a first end section. The first main section extends along a first direction and has a first width measured along a second direction that is perpendicular to the first direction. The first end section has a second width measured along the second direction. The second width of the first end section is larger than the first width of the first main section.

In another aspect of the present disclosure, a 3D memory device includes a conductor/insulator stack containing a conductive layer and a dielectric layer alternatingly stacked, a channel hole structure in a region of memory cells in the conductor/insulator stack, a first gate line slit (GLS) structure, a second GLS structure, a third GLS structure adjacent to the second GLS structure, and a first staircase contact (SCT) adjacent to the third GLS structure. The first, second, and third GLS structures extend in a first direction. The region of memory cells is between the first and second GLS structures along a second direction that is perpendicular to the first direction. The second and third GLS structures are separated by a predetermined distance in the first direction. The first SCT is electrically connected with the region of memory cells by a layer of an electrically conductive material adjacent to the third GLS structure.

In another aspect of the present disclosure, a system includes a memory device and a memory controller for controlling the memory device. The memory device includes a conductor/insulator stack containing a conductive layer and a dielectric layer alternatingly stacked, a channel hole structure in a region of memory cells in the conductor/insulator stack, and a first GLS structure adjacent to the region of memory cells. The first GLS structure includes a first main section and a first end section. The first main section extends along a first direction and has a first width measured along a second direction that is perpendicular to the first direction. The first end section has a second width measured along the second direction. The second width of the first end section is larger than the first width of the first main section.

Other aspects of the present disclosure can be understood by those skilled in the art in light of the description, the claims, and the drawings of the present disclosure.

BRIEF DESCRIPTION OF THE DRAWINGS

FIG. 23 illustrates a schematic flow chart of fabrication of a 3D memory device according to various aspects of the present disclosure;

DETAILED DESCRIPTION

The following describes the technical solutions according to various aspects of the present disclosure with reference to the accompanying drawings. Wherever possible, the same reference numbers will be used throughout the drawings to refer to the same or like parts. Apparently, the described aspects are merely some but not all of the aspects of the present disclosure. Features in various aspects may be exchanged and/or combined.

FIGS. 1-20 schematically show a fabrication process of an exemplary 3D array device 100 according to aspects of the present disclosure. The 3D array device 100 is a part of a memory device and may also be referred to as a 3D memory structure. Among the figures, top views are in an X-Y plane and cross-sectional views are in a Y-Z plane or taken along a line in the X-Y plane.

Figure 1:
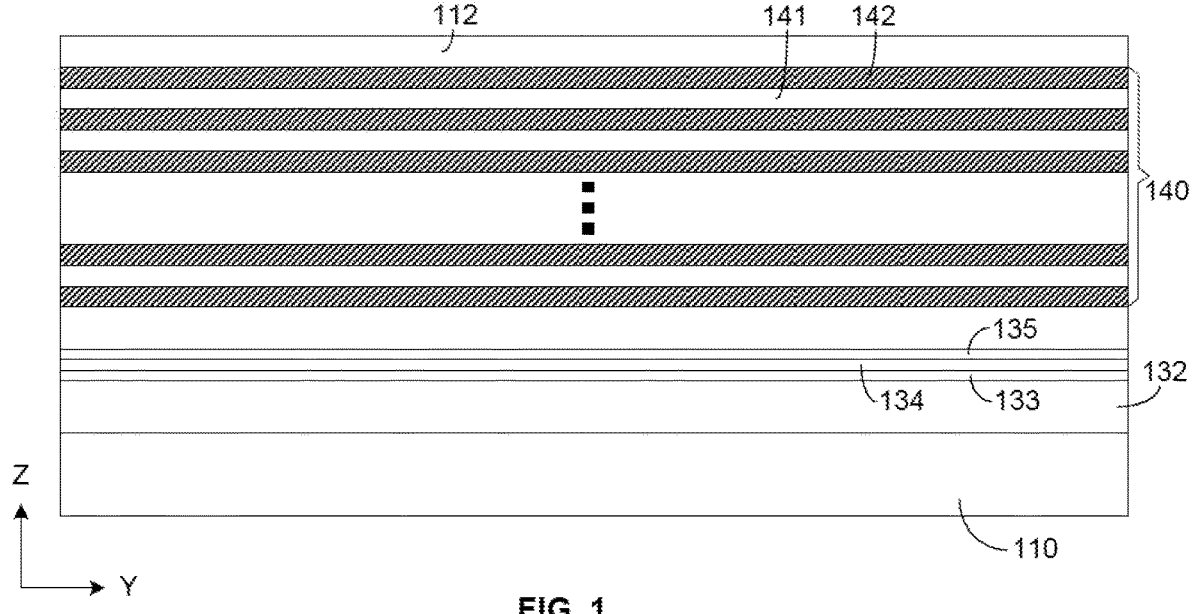
FIG. 1 illustrates a cross-sectional view of a structure of an exemplary 3D array device at a certain stage during a fabrication process according to various aspects of the present disclosure.

As shown in a cross-sectional view in FIG. 1, a structure of the 3D array device 100 includes a substrate 110. In some aspects, the substrate 110 may include a single crystalline silicon layer. The substrate 110 may also include another semiconductor material, such as germanium (Ge), silicon-germanium (SiGe), silicon carbide (SiC), silicon-on-insulator (SOI), germanium-on-insulator (GOI), polysilicon, or a Group III-V compound such as gallium arsenide (GaAs) or indium phosphide (InP). Optionally, the substrate 110 may also include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer in descriptions below.

In some aspects, a layer 132 (e.g., a polysilicon layer) is deposited over the substrate 110. Further, layers 133, 134, and 135 are grown sequentially over the layer 132. The layers 133, 134, and 135 may exemplarily be a silicon oxide layer, a silicon nitride layer, and a polysilicon layer. Optionally, the layers 132-134 may be sacrificial layers and etched away at a certain stage. The layers may be deposited by chemical vapor deposition (CVD), physical vapor deposition (PVD), atomic layer deposition (ALD), or a combination thereof.

Further, a dielectric stack 140 is formed over the layers 132-135. The dielectric stack 140 may be considered as a dielectric stack structure that includes multiple pairs of stack layers, for example, including first dielectric layers 141 and second dielectric layers 142, stacked alternately over each other. Some layers of the dielectric stack 140 are used to form memory cells. In some cases, the layers for fabricating memory cells may include 64 pairs, 128 pairs, or more than 128 pairs of the first and second dielectric layers 141 and 142.

In some aspects, the first dielectric layers 141 and the second dielectric layers 142 are made of different materials. In descriptions below, the first dielectric layer 141 includes a silicon oxide layer exemplarily, which is used as an isolation stack layer, while the second dielectric layer 142 includes a silicon nitride layer exemplarily, which is used as a sacrificial stack layer. The sacrificial stack layer will be subsequently etched out and replaced by a conductive stack layer. The first dielectric layers 141 and second dielectric layers 142 may be deposited via CVD, PVD, ALD, or a combination thereof. Further, a dielectric layer 112 (e.g., a silicon oxide layer) is deposited over the dielectric stack 140 by CVD or PVD.

Figure 2:
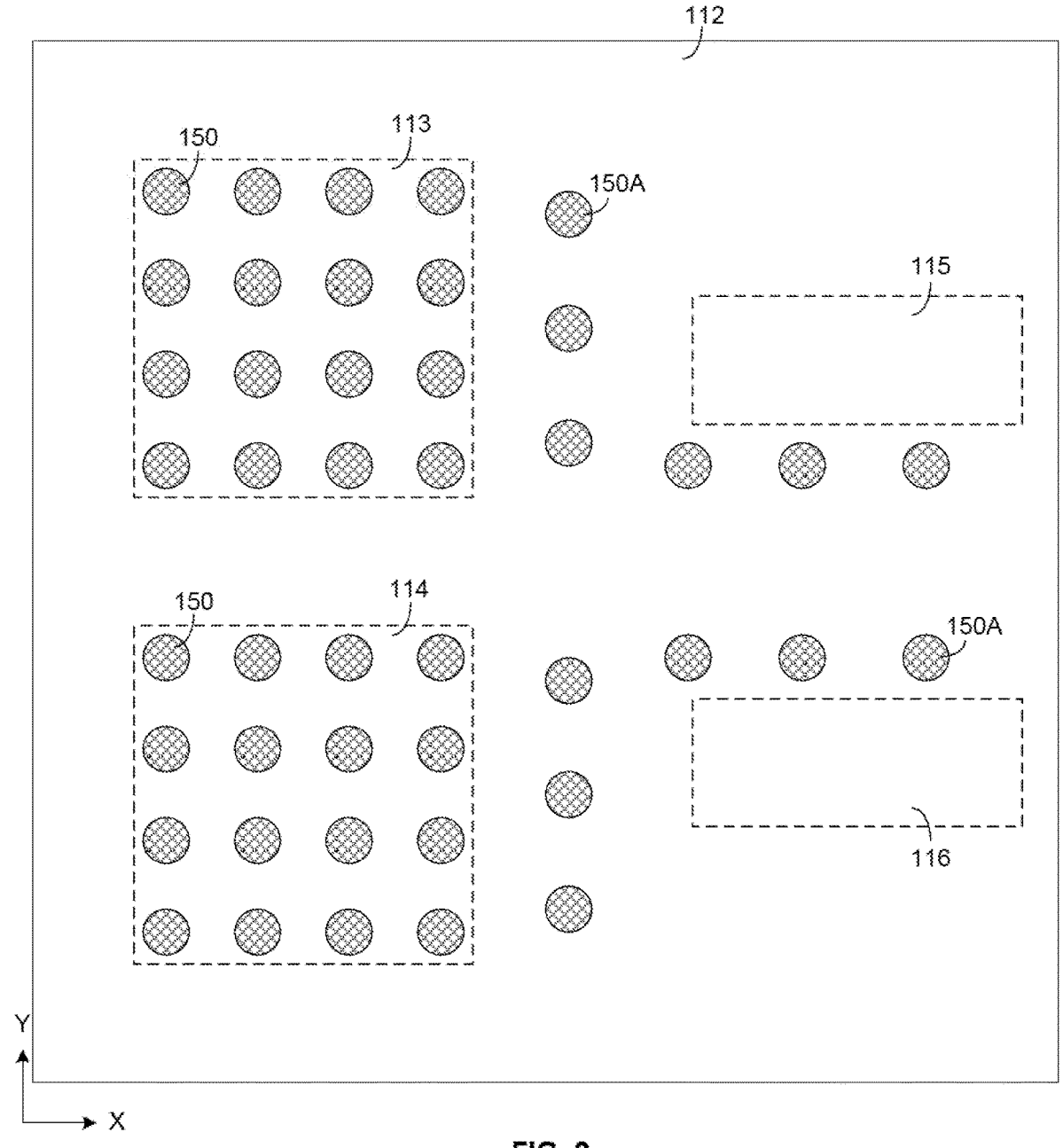
FIG. 2 illustrates a top view of the 3D array device shown in FIG. 1 after channel hole structures are formed during the fabrication process according to various aspects of the present disclosure.

FIG. 2 shows a schematic top view of the structure of the 3D array device 100 after channel hole structures are formed according to aspects of the present disclosure. Channel hole structures 150 are configured in memory cell regions 113 and 114. Dummy channel hole structures 150A are arranged outside the memory cell regions 113 and 114 and staircase contact (SCT) regions 115 and 116. Optionally, some of the dummy channel hole structures 150A are between the memory cell regions 113 and 114 and SCT regions 115 and 116. The SCT regions 115 and 116 are arranged for SCTs. The quantity, dimension, and arrangement of the channel hole structures 150 and dummy channel hole structures 150A as shown in FIG. 2 and in other figures in the present disclosure are exemplary and for description purposes, although any suitable quantity, dimension, and arrangement may be used for the disclosed 3D array device 100 according to various aspects of the present disclosure.

Figure 3:
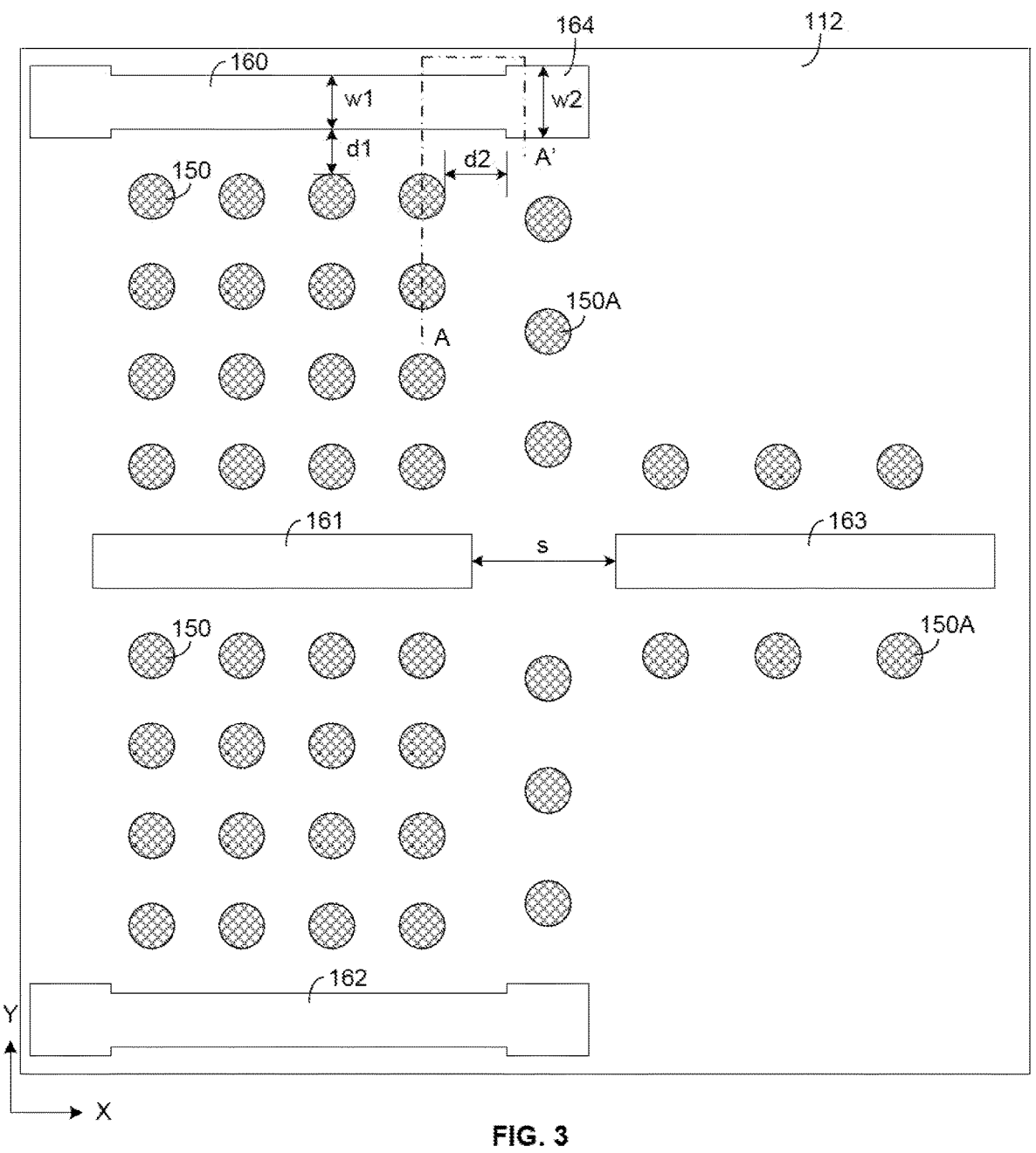
FIGS. 3 and 4 illustrate a top view and a across-sectional view of the 3D array device shown in FIG. 2 after openings for GLS are formed according to various aspects of the present disclosure.
Figure 4:
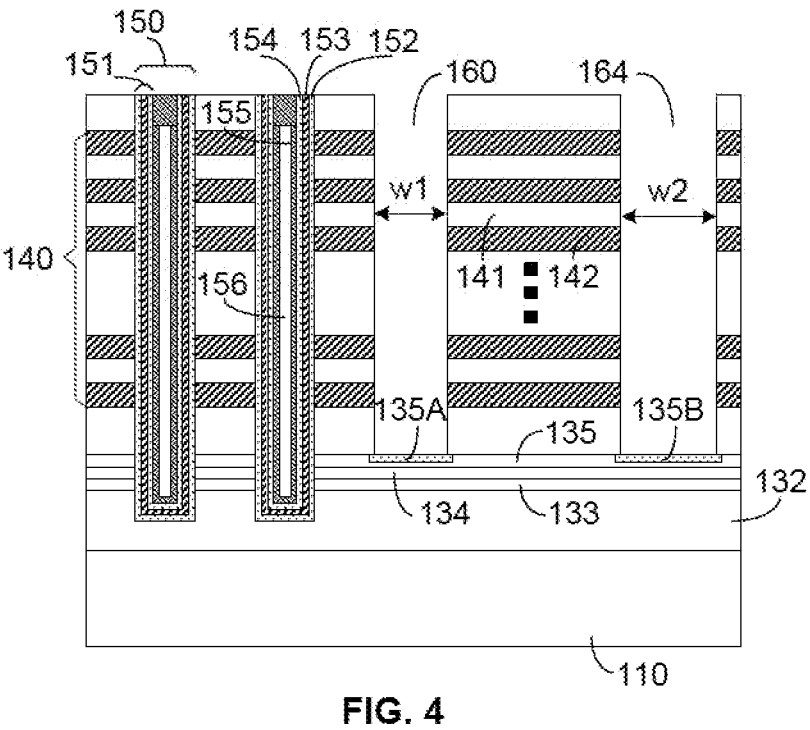

FIGS. 3 and 4 show a schematic top view and a schematic cross-sectional view of the structure of the 3D array device 100 shown in FIG. 2 after openings for gate line slit (GLS) are formed according to aspects of the present disclosure. The cross-sectional view shown in FIG. 4 is taken along a line AA' of FIG. 3. A GLS may also be referred to as a GLS structure. Openings 160, 161, 162, and 163 are formed for the GLS structures exemplarily. The 3D array device 100 has a great number of channel hole structures 150 arranged in memory planes (not shown). Each memory plane is divided into memory blocks and memory fingers by the GLS structures. For example, the channel hole structures 150 between the openings 160 and 162 may reflect a memory block, which exemplarily includes two memory fingers separated by the opening 161.

The openings for GLS may be formed by, for example, a dry etch process or a combination of dry and wet etch processes. In a horizontal plane or X-Y plane, the openings 160-163 extend in the X direction, respectively. The memory cell region 113 of FIG. 2 is between the openings 160 and 161. The memory cell region 114 of FIG. 2 is between the openings 161 and 162. The openings 160 and 162 each have a main section and two enlarged end sections. For example, the opening 160 has an enlarged end section 164. The openings 161 and 163 each have a main section without any enlarged end section. The main sections of the openings 160-163 may have the same width or similar width values in the Y direction. The enlarged end sections of the openings 160 and 162 may have the same width or similar width values in the Y direction. Provided the main portions have a width w1, while the enlarged end sections have a width w2. In some aspects, the value of w2 may be in a range of 1.2w1 to 1.8w1 or at least 10-50% larger than that of w1. The main section is closer to the memory cell region than the enlarged end section. Provided the distance between the main section of the opening 160 and the channel hole structures 150 is d1 in the Y direction, and the distance between the enlarged end section 164 and the channel hole structure 150 is d2 in the X direction. d2 may represent the closest distance between the enlarged end section 164 and a channel hole structure 150. In some cases, d2 may be at least 20-50% larger than d1.

As shown in FIG. 3, the opening 161 is between the openings 160 and 162 in the Y direction. The openings 161 and 163 are separated by a distance s in the X direction. In some aspect, the value of s may be at least 2-3 times of the value of w1. The openings 161 and 163 may be aligned with respect to the Y axis in some embodiments. Optionally, the openings 161 and 163 may not be aligned with respect to the Y axis. As shown in FIG. 4, the openings such as the opening 160 and enlarged end section 164 extend through the dielectric stack 140 and reach the layer 135 in the Z direction or in a direction approximately perpendicular to the substrate 110. As illustrated above, the layer 135 may be a polysilicon layer. In some cases, an oxidation process is performed such that exposed portions of the layer 135 at the bottoms of the openings 160-163 are oxidized and become oxide regions, such as oxide regions 135A and 135B as shown in FIG. 4.

FIG. 4 also shows the channel hole structures 150 that extend in the Z direction or in a direction approximately perpendicular to the substrate 110. The channel hole structures 150 and dummy channel hole structures 150A are formed in channel holes concurrently. The channel holes may be formed by, for example, a dry etch process or a combination of dry and wet etch processes. The channel holes may have a cylindrical shape or pillar shape that extends through the dielectric stack 140, the layer 133-135, and partially penetrates the layer 132. In some aspects, the channel holes have a taper angle (not shown), and the horizontal dimension of the channel hole decreases gradually from the top to the bottom. After the channel holes are formed, a functional layer 151 is deposited on the sidewall and bottom of the channel hole. The functional layer 151 includes a blocking layer 152 on the sidewall and bottom of the channel hole to block an outflow of charges, a charge trap layer 153 on a surface of the blocking layer 152 to store charges during an operation of the 3D array device 100, and a tunneling layer 154 on a surface of the charge trap layer 153. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, or another wide bandgap material. The charge trap layer 153 may include one or more layers that may include one or more materials. The materials for the charge trap layer 153 may include polysilicon, silicon nitride, silicon oxynitride, nanocrystalline silicon, a high-k dielectric material such as aluminum oxide or hafnium oxide, or another wide bandgap material. The tunneling layer 154 may include one or more layers that may include one or more materials. The material for the tunneling layer 154 may include silicon oxide, silicon nitride, silicon oxynitride, a high-k dielectric material such as aluminum oxide or hafnium oxide, or another wide bandgap material.

Further, a semiconductor channel 155 is deposited on a surface of the tunneling layer 154. The semiconductor channel 155 includes a polysilicon layer in some aspects. Optionally, the semiconductor channel 155 may include an amorphous silicon layer. Like the channel holes, the semiconductor channel 155 also extends through the dielectric stack 140 and layers 133-135, and into the layer 132. The blocking layer 152, the charge trap layer 153, the tunneling layer 154, and the semiconductor channel 155 may be deposited by, e.g., CVD and/or ALD. The structure formed in a channel hole, including the functional layer 151 and semiconductor channel 155, is referred to as the channel hole structure.

After the semiconductor channel 155 is formed, the opening of the channel hole is filled by an oxide material 156 and a conductive plug that connects to the semiconductor channel 155 electrically. In some cases, the functional layer 151 includes an oxide-nitride-oxide (ONO) structure. That is, the blocking layer 152 is a silicon oxide layer, the charge trap layer 153 is a silicon nitride layer, and the tunneling layer 154 is another silicon oxide layer.

Optionally, the functional layer 151 may have a structure different from the ONO configuration. In the following descriptions, the ONO structure is used exemplarily for the blocking layer 152, the charge trap layer 153, and the tunneling layer 154.

Figure 5:
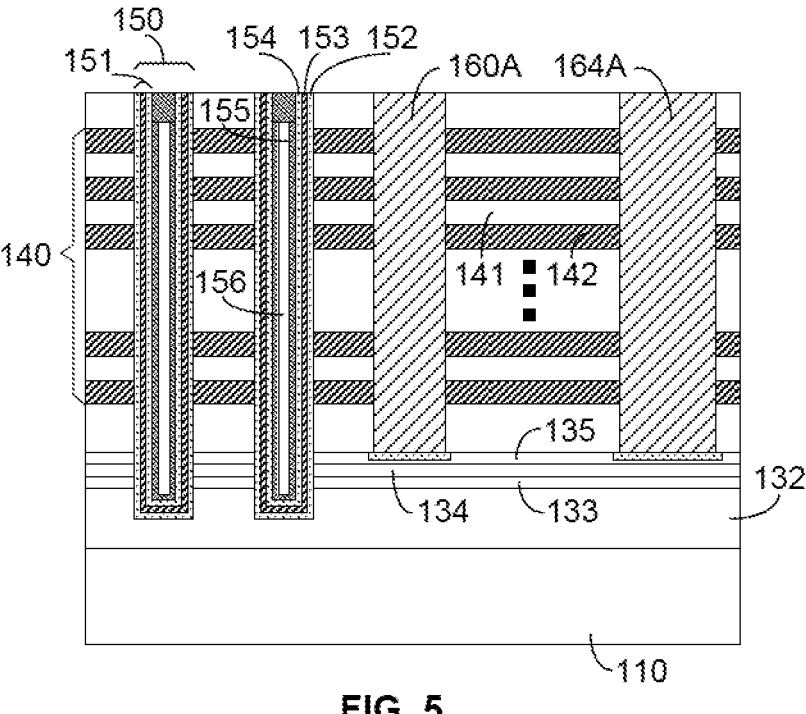
FIG. 5 illustrates a cross-sectional view of the 3D array device shown in FIGS. 3 and 4 at a certain stage during the fabrication process according to various aspects of the present disclosure.

After the oxide regions at the bottoms of the openings 160-163 are made, CVD and/or ALD is performed to fill the openings with a material such as polysilicon. The main sections of the openings are filled with filling structures 160A, 161A, 162A, and 163A, respectively. The enlarged end sections are filled with end filling structures, respectively. The filling structure 160A and an end filling structure 164A are depicted in FIG. 5 in a cross-sectional view. Further, the end filling structures are removed by a selective etch, such as a selective wet etch. Openings are formed at the end sections after the selective etch. The openings are subsequently filled by a dielectric material (e.g., silicon oxide) by CVD and/or ALD. Dielectric end blocks are formed in the enlarged end sections.

Figure 6:
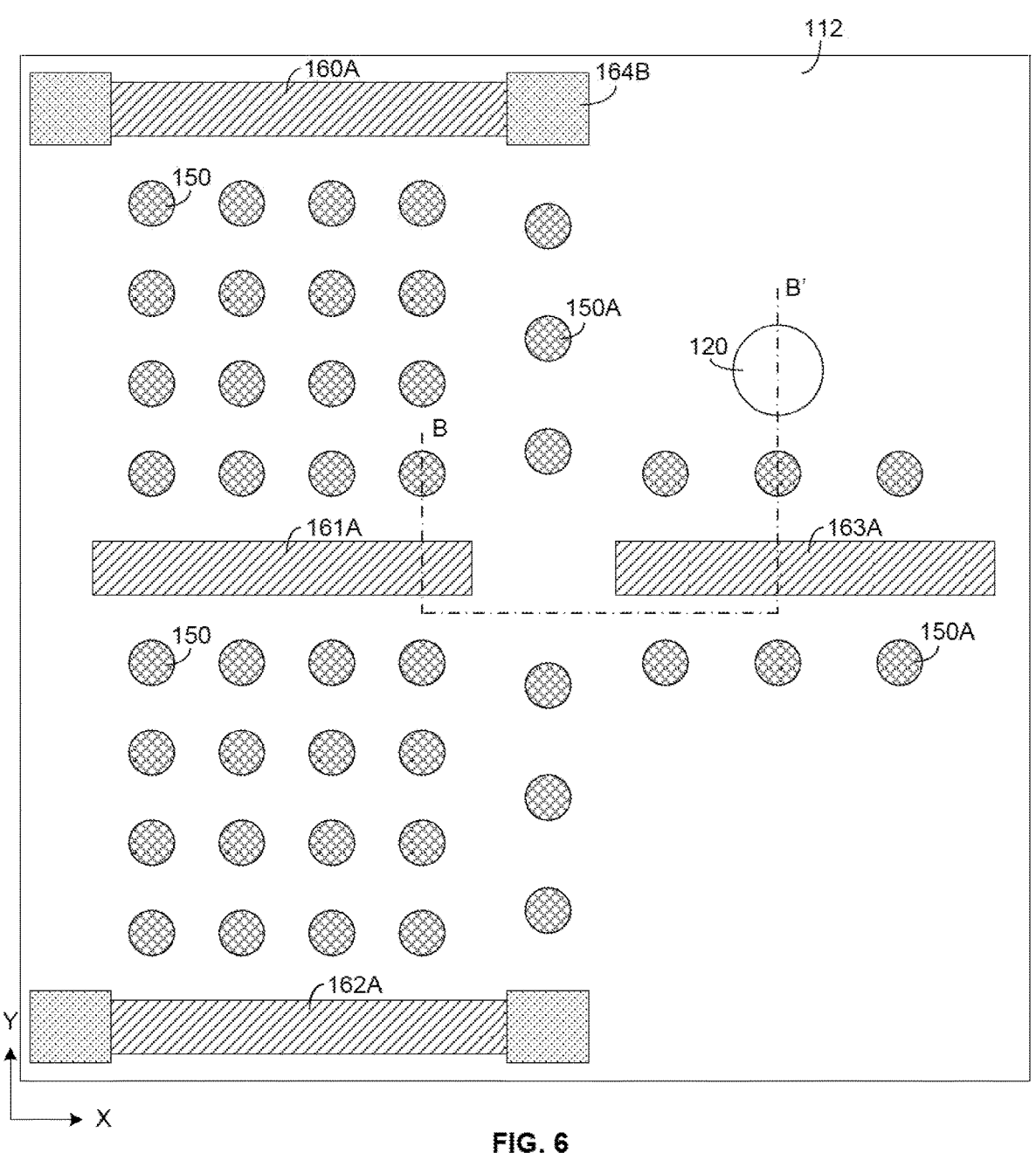
FIGS. 6 and 7 illustrate a top view and a cross-sectional view of the 3D array device shown in FIG. 5 after an opening for staircase contact (SCT) is formed according to various aspects of the present disclosure.

FIG. 6 shows a schematic top view of the structure of the 3D array device 100 after the dielectric end blocks are made according to aspects of the present disclosure. The end blocks connect to and contact the filling structure 160A or 162A. For example, an end block 164B replaces the end filling structure 164A and contacts the filling structure 160A in the X direction. Since the end blocks are formed in the enlarged end sections, the end blocks are disposed away from the memory cells regions or away from the channel hole structures 150. In the Z direction, the end blocks extend through the dielectric stack 140 and reach the oxide regions. In some cases, the end blocks facilitate separation between memory blocks.

As illustrated above, the filling structures 160A-163A and end blocks (e.g., the end block 164B) are formed after the channel hole structures 150 are made. Alternatively, the filling structures and end blocks may be formed before the channel hole structures 150 are made. For example, the openings for GLS may be etched first. Then the filling structures and end blocks may be fabricated, respectively. Further, the channel hole structures 150 and dummy channel hole structures 150A may be formed.

Figure 7:
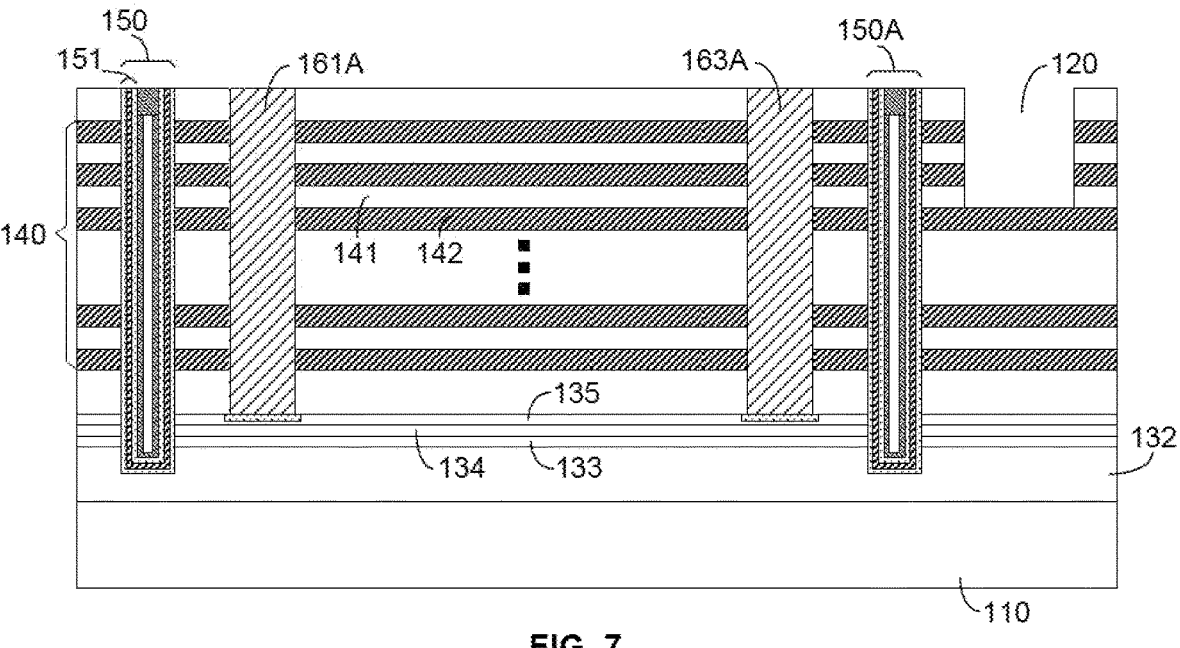

FIG. 6 also shows an opening 120 for SCT. A cross-sectional view of the opening 120 is depicted in FIG. 7 and taken along a line BB' of FIG. 6. The opening 120 may be formed by, for example, a dry etch process or a combination of dry and wet etch processes. The opening for SCT such as the opening 120 may have a circular shape in an X-Y plane in some embodiments. Optionally, the opening for SCT may have another shape (e.g., a square or rectangular shape) in the X-Y plane in some other cases. In descriptions below, the circular shape is used exemplarily. As shown in FIGS. 6 and 7, the opening 120 extends in the X and Y directions horizontally, and penetrates through the dielectric stack 140 and reaches a target second dielectric layer 142 in the Z direction or a direction approximately perpendicular to the substrate 110. As aforementioned, the second dielectric layer 142 may be a sacrificial silicon nitride layer. At the bottom of the opening 120, the target second dielectric layer 142 is exposed. Further, a dielectric material (e.g., silicon oxide or aluminum oxide) is deposited to grow a spacer layer 121A by CVD or ALD. The spacer layer 121A is configured to protect second dielectric layers 142 that are exposed on the sidewall of the opening 120.

An etch, such as a dry etch, is conducted to etch away the spacer layer 121A at the bottom of the opening 120 to expose the target second dielectric layer 142. Further, a selective wet etch is performed to etch out a section of the target second dielectric layer 142. A cavity (not shown) is formed between the first dielectric layers 141. The selective wet etch is conducted for a predetermined etch time to control the depth of the cavity.

Figure 8:
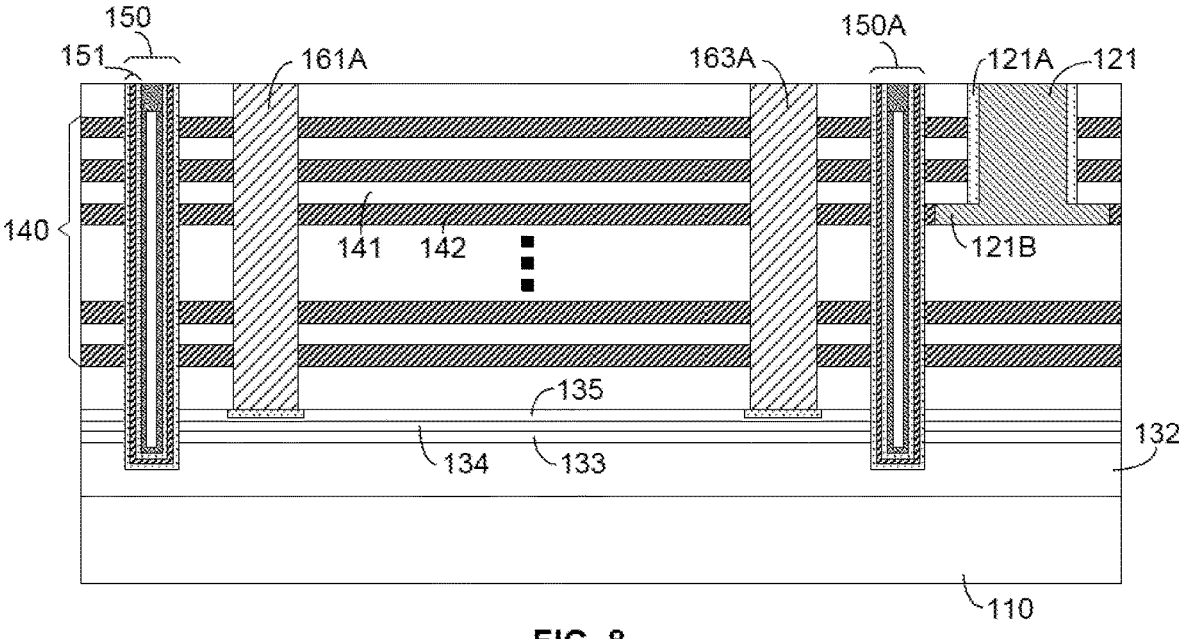
FIGS. 8 and 9 illustrate a cross-sectional view and a top view of the 3D array device shown in FIGS. 6 and 7 at a certain stage according to various aspects of the present disclosure.
Figure 9:
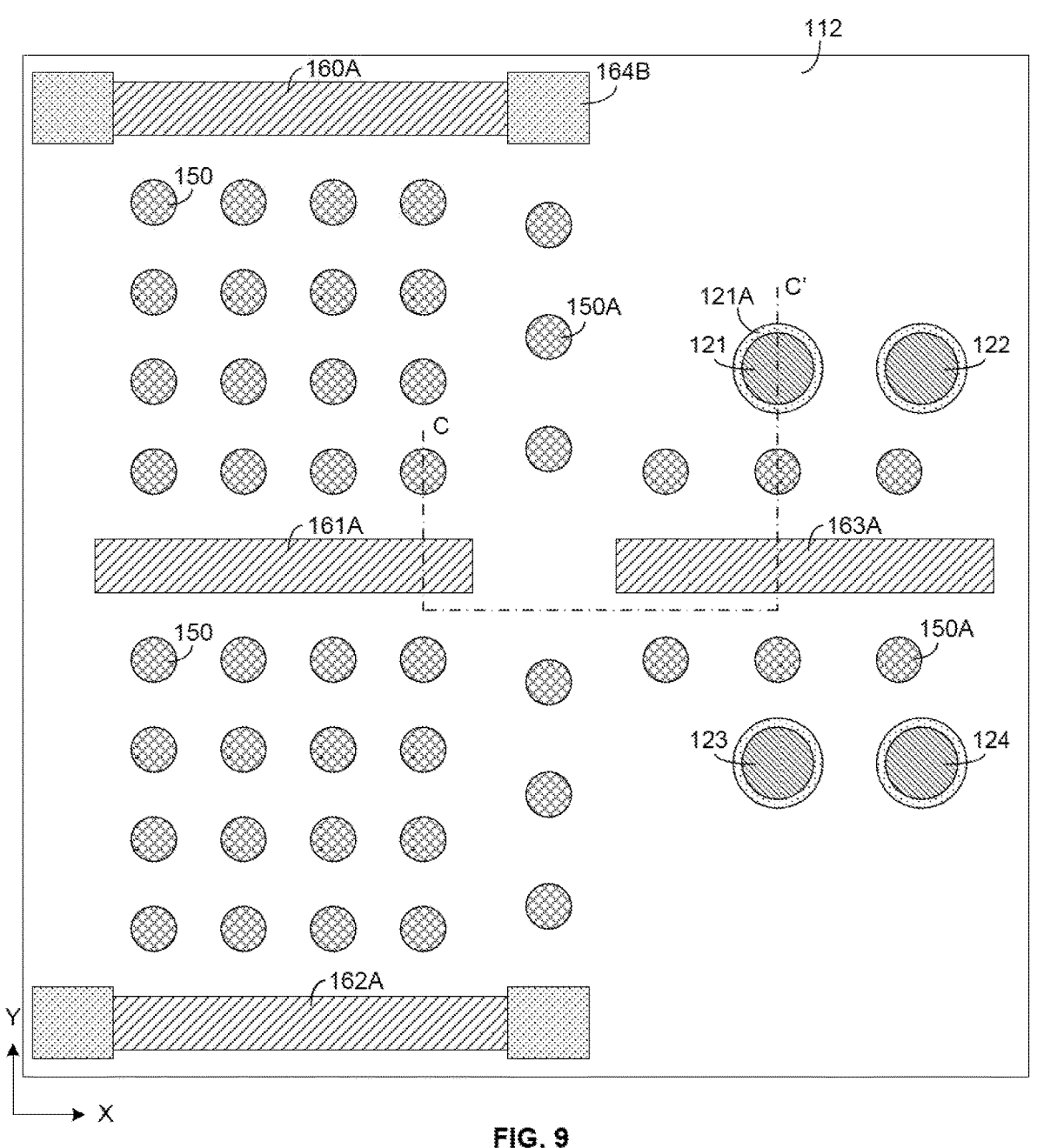

Further, a filling material such as carbon is deposited to fill the opening 120 and the cavity by CVD and/or ALD. The opening 120 and the cavity are filled with a filling structure 121 and a filling layer 121B, respectively. The filling layer 121B is deposited between adjacent first dielectric layers 141. FIGS. 8 and 9 show a schematic cross-sectional view and a schematic top view after the filling structure 121 and filling layer 121B are formed. The cross-sectional view shown in FIG. 8 is taken along a line CC' of FIG. 9.

Further, the methods used for making the opening 120, spacer layer 121A, filling structure 121, and filling layer 121B are performed repeatedly. More openings for SCT are formed to reach respective second dielectric layers 142, respectively. For each opening, a spacer layer is deposited on the sidewall, a cavity is etched between the first dielectric layers 141 at the bottom, and then a filling layer and a filling structure are deposited. The spacer layer, filling layer, and filling structure in each opening contain the same materials as those of the spacer layer 121A, filling structure 121, and filling layer 121B, respectively. Filling structures 121, 122, 123, and 124 are shown in FIG. 9 exemplarily.

Figure 10:
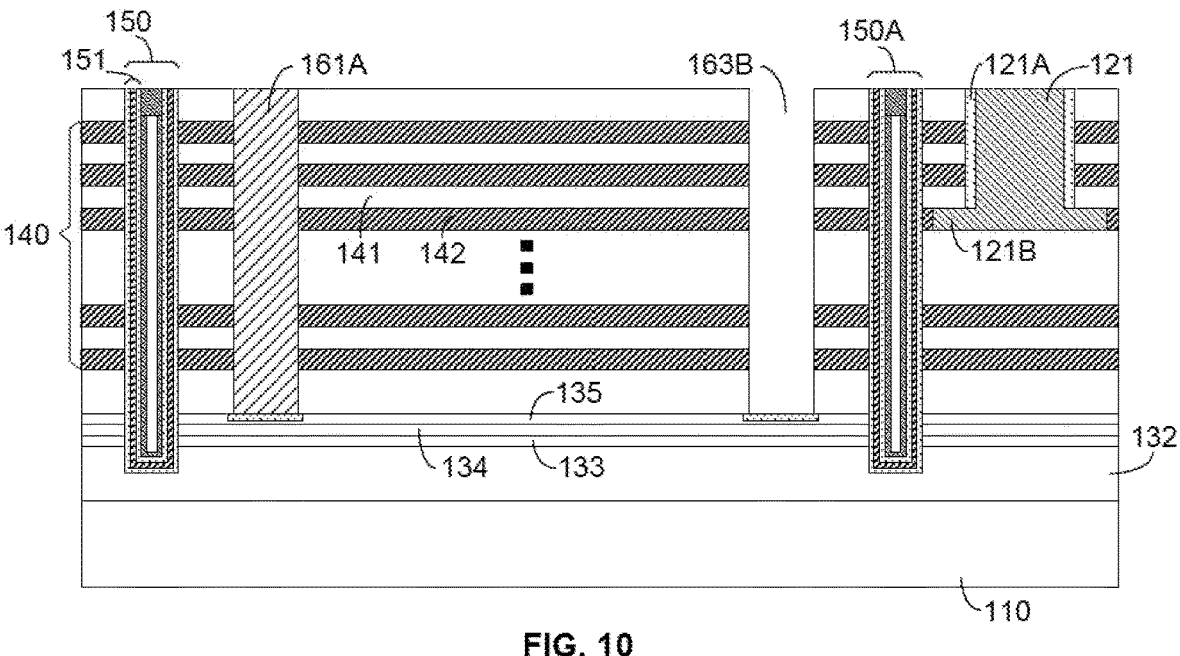
FIGS. 10 and 11 illustrate cross-sectional views of the 3D array device shown in FIG. 9 at certain stages in the fabrication process according to various aspects of the present disclosure.

FIG. 10 shows a schematic cross-sectional view of the structure of the 3D array device 100 after the filling structure 163A is etched according to aspects of the present disclosure. The filling structure 163A is removed in a selective etch (e.g., a selective wet etch), creating an opening 163B. Sides of the second dielectric layers 142 and a bottom oxide region are exposed in the opening 163B.

Figure 11:
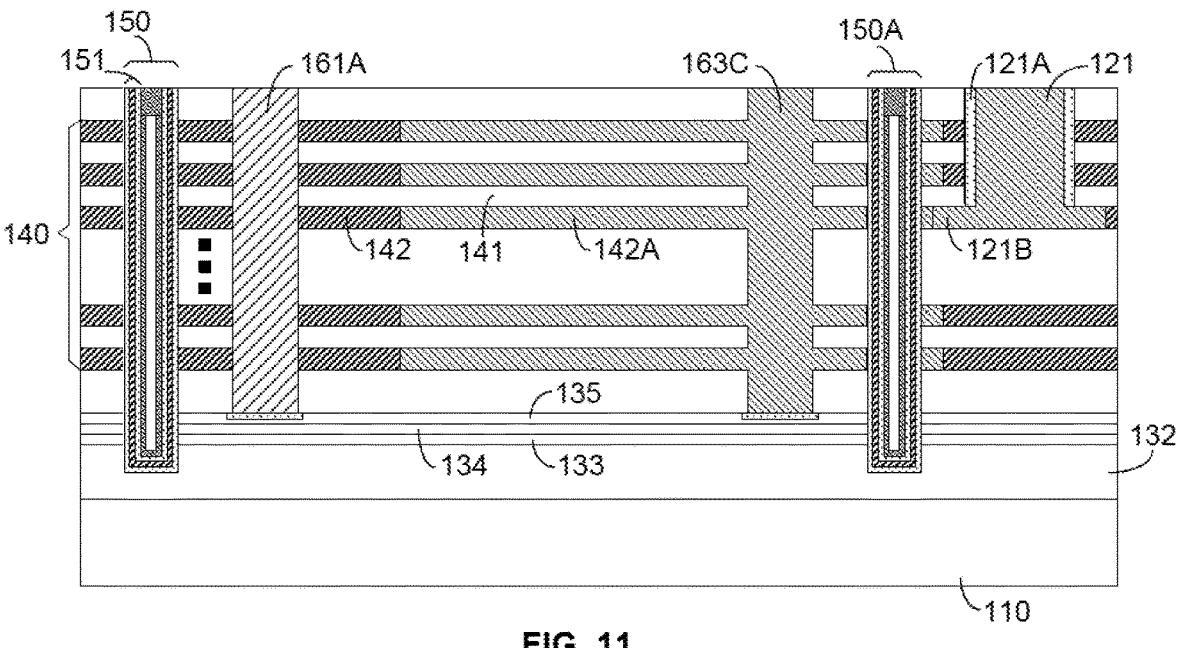

Further, a selective etch is performed for a predetermined time period to remove certain sections of the exposed second dielectric layers 142, leaving cavities (not shown) between the first dielectric layers 141. The filling layers (e.g., the filling layer 121B) are exposed in corresponding cavities. The opening 163B and the cavities are filled by a material that is the same as that of the filling layer 121B and filling structures 121-124. A filling structure 163C is formed in the opening 163B, while layers 142A are formed in the cavities, as illustrated in FIG. 11. Each of layers 142A is between adjacent first dielectric layers 141 and contacts a corresponding second dielectric layer 142. Some of the layer 142A contact the filling layers (e.g., the filling layer 121B), respectively.

Figure 12:
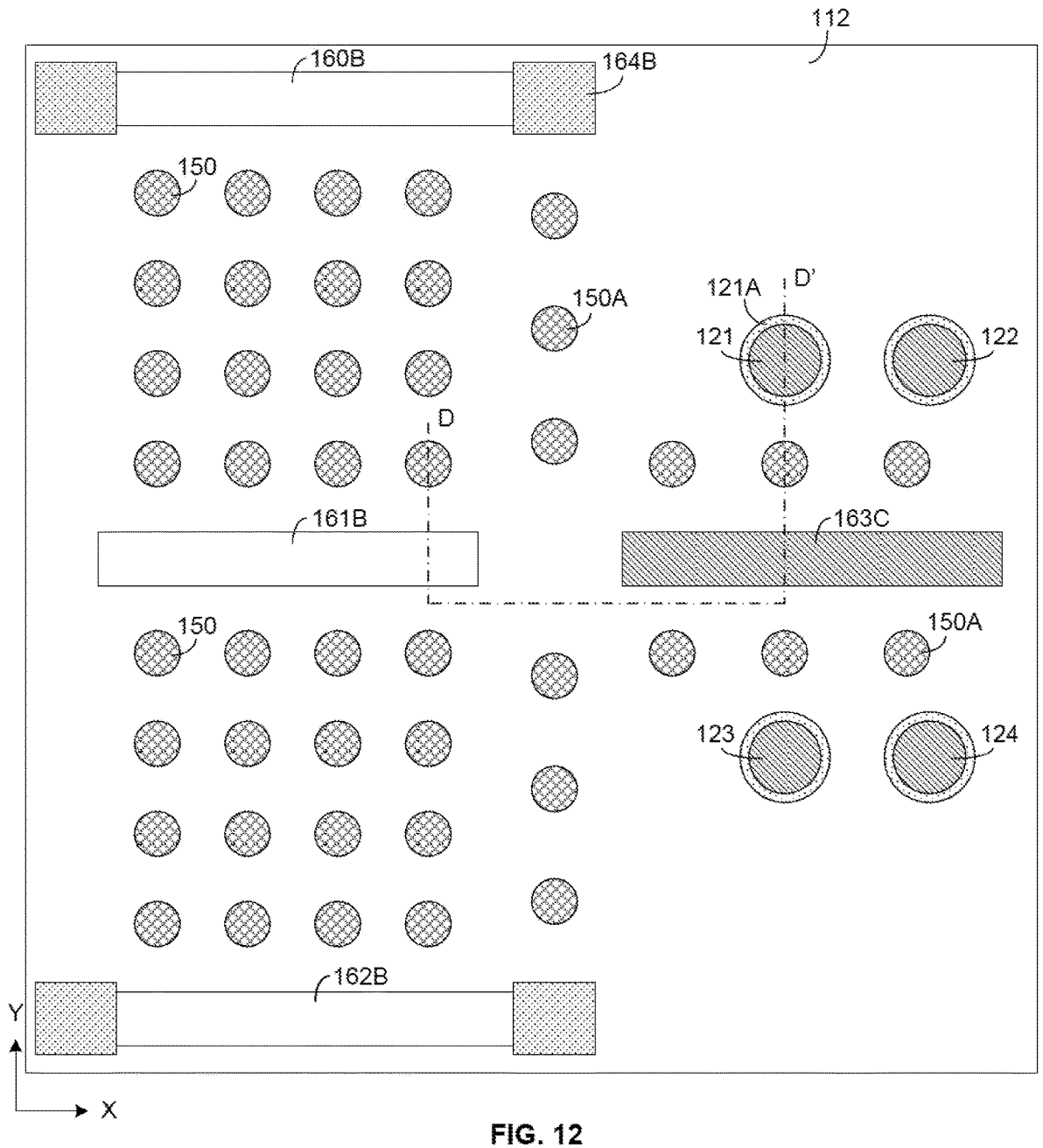
FIGS. 12 and 13 illustrate a top view and a cross-sectional view of the 3D array device shown in FIG. 11 after sacrificial stack layers are etched according to various aspects of the present disclosure.
Figure 13:
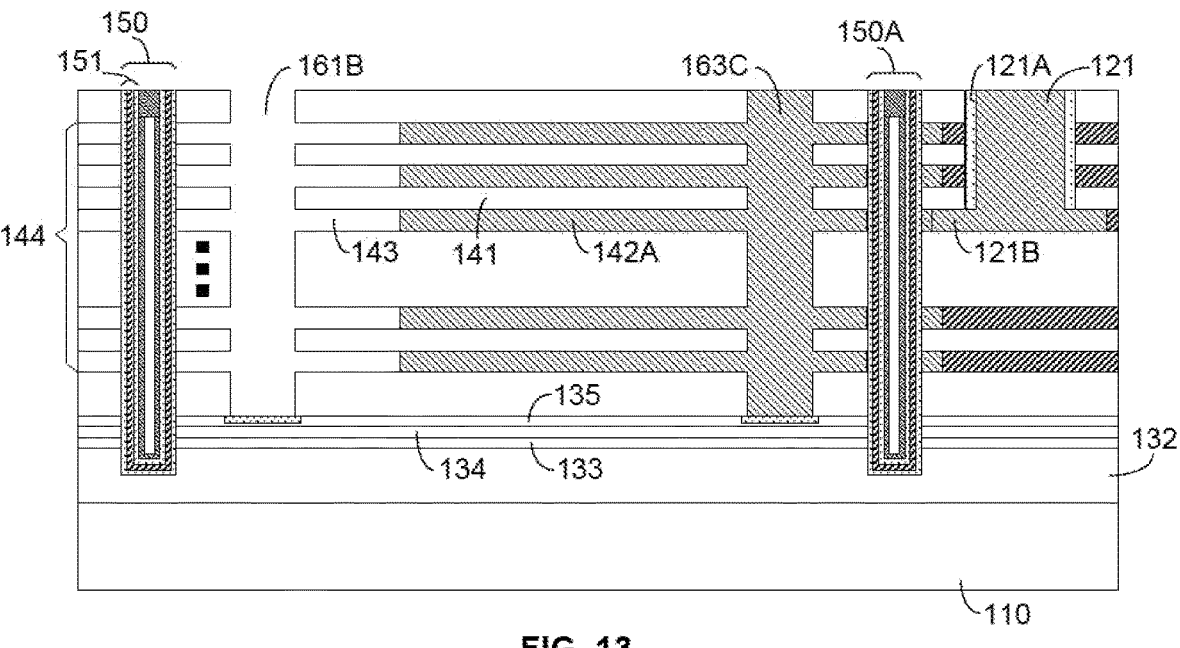

FIGS. 12 and 13 show a schematic top view and a schematic cross-sectional view of the structure of the 3D array device 100 at a certain stage according to aspects of the present disclosure. The cross-sectional view shown in FIG. 13 is taken along a line DD' of FIG. 12. Openings 160B, 161B, and 162B are created, after the filling structures 160A-162A are removed in a selective etch (e.g., a selective wet etch). The oxide regions at the bottoms of the openings and sides of the second dielectric layer 142 on the sidewalls are exposed. Thereafter, the exposed second dielectric layers 142 are removed in a selective etch such as a selective wet etch, creating cavities 143 between the first dielectric layers 141 and changing the dielectric stack 140 into a dielectric stack 144, which is depicted exemplarily in FIG. 13. The layers 142A are exposed in some of the cavities 143, respectively. Further, the filling structures 121-124 and 163C, filling layers, layers 142A, and spacer layers are etched away in one or more selective wet etches. When the filling structures 121-124 and 163C, filling layers, and layers 142A are made of carbon, these structures and layers may also be selectively removed by a burning process. Openings are formed by removal of the filling structures 121-124 and 163C and spacer layers. The cavities 143 expand horizontally after removal of the filling layers and layers 142A.

Figure 14:
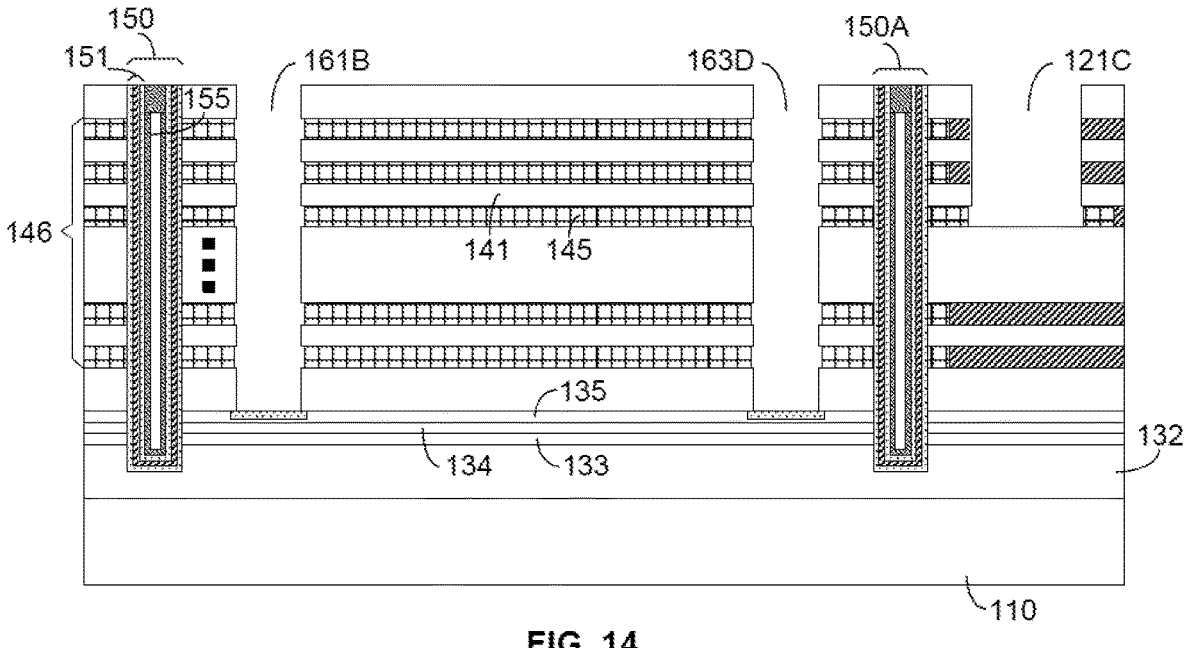
FIGS. 14 and 15 illustrate a cross-sectional view and a top view of the 3D array device shown in FIGS. 12 and 13 after conductive layers are formed according to various aspects of the present disclosure.
Figure 15:
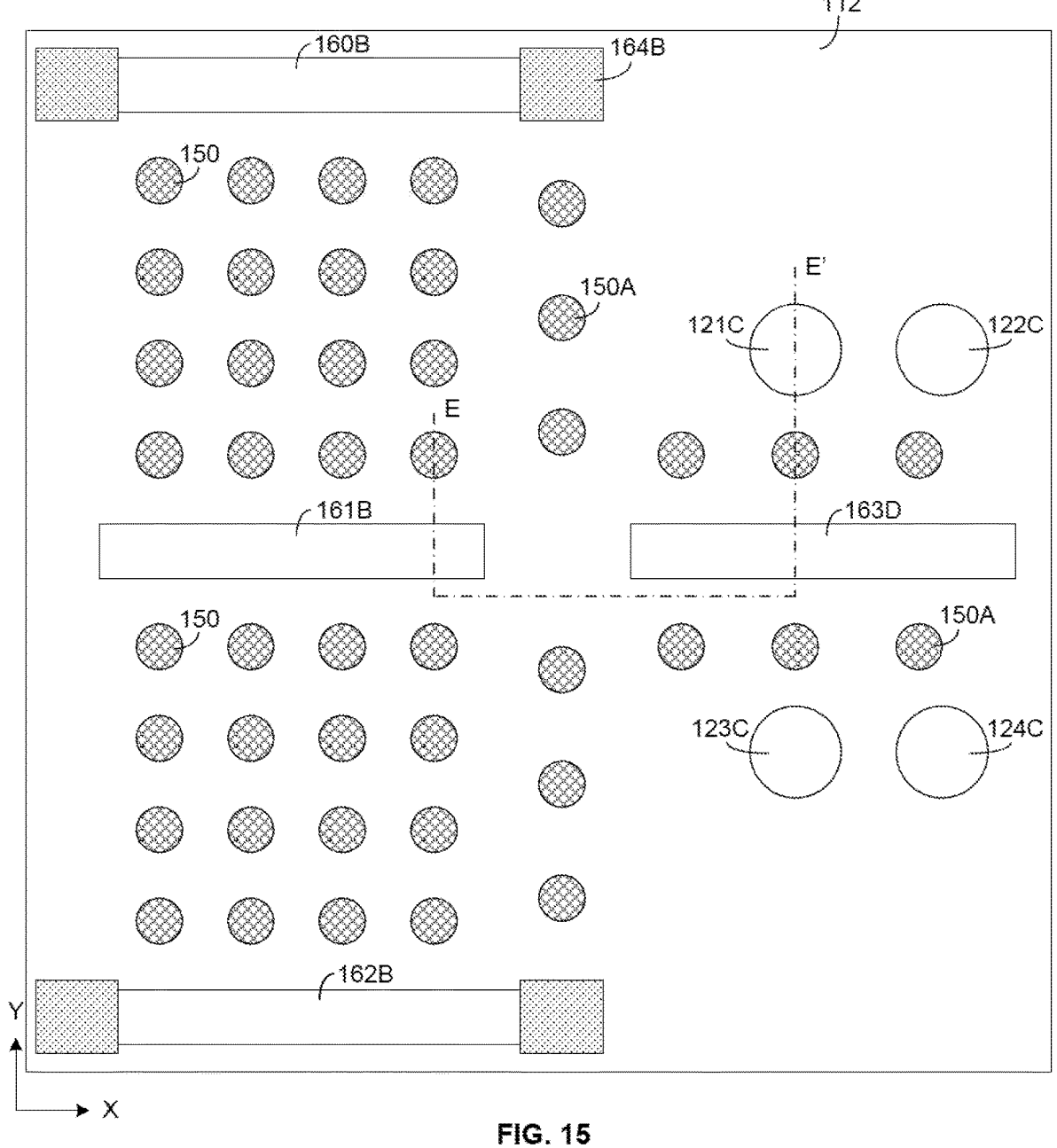

Thereafter, a conductive material such as tungsten (W) is grown to fill the cavities 143, forming conductive layers 145 between the first dielectric layers 141. After the conductive layers 145 are fabricated, the dielectric stack 144 is converted into a conductor/insulator stack 146, as shown in FIG. 14. FIGS. 14 and 15 show a schematic cross-sectional view and a schematic top view of the structure of the 3D array device 100 at a certain stage. The cross-sectional view shown in FIG. 14 is taken along a line EE' of FIG. 15. FIG. 15 shows openings 121C-124C, 160B-162B, and 163D that are formed by removing the filling structures. The stack 146 may be considered as a conductor/insulator stack structure that contains the channel hole structures 150, or the functional layers 151 and semiconductor channels 155. The conductor/insulator stack 146 includes the first dielectric layers 141 and conductive layers 145 that are alternatingly stacked over each other. In some aspects, before metal W is deposited in the cavities 143, a dielectric layer (not shown) of a high-k dielectric material such as aluminum oxide may be deposited. Thereafter, a layer of a conductive material such as titanium nitride (TiN) (not shown) is deposited. Further, metal W is deposited to form the conductive layers 145. CVD and/or ALD may be used in the deposition processes. Alternatively, another conductive material, such as molybdenum (Mo), ruthenium (Ru), cobalt (Co), copper (Cu), aluminum (Al), titanium (Ti), tantalum (Ta), tantalum nitride (TaN), doped silicon, or any combination thereof, may be used to form the conductive layers 145.

Referring to FIG. 14, a portion of each functional layer 151 in a channel hole structure 150 is between a portion of one of the conductive layers 145 and a portion of a semiconductor channel 155 in the channel hole structure 150. The conductive layer 145 is configured to connect rows of NAND memory cells in an X-Y plane and configured as a word line for the 3D array device 100. The semiconductor channel 155 formed in the channel hole structure 150 is configured to connect a column or a string of NAND memory cells along the Z direction and configured as a bit line for the 3D array device 100. As such, a portion of the functional layer 151 in the channel hole structure 150 in an X-Y plane, as a part of a NAND memory cell, is arranged between a conductive layer 145 and a semiconductor channel 155, i.e., between a word line and a bit line. The functional layer 151 may also be considered as disposed between the semiconductor channel 155 and the conductor/insulator stack 146. A portion of the conductive layer 145 that is around a portion of the channel hole structure 150 functions as a control gate or gate electrode for a NAND memory cell. The 3D array device 100 can be considered as including a 2D array of strings of NAND cells (such a string is also referred to as a "NAND string") in the stack 146 or the conductor/insulator stack structure. Each NAND string contains multiple NAND memory cells and extends vertically toward the substrate 110. The NAND strings form a 3D array of the NAND memory cells through the conductor/insulator stack 146 over the substrate 110.

Figure 16:
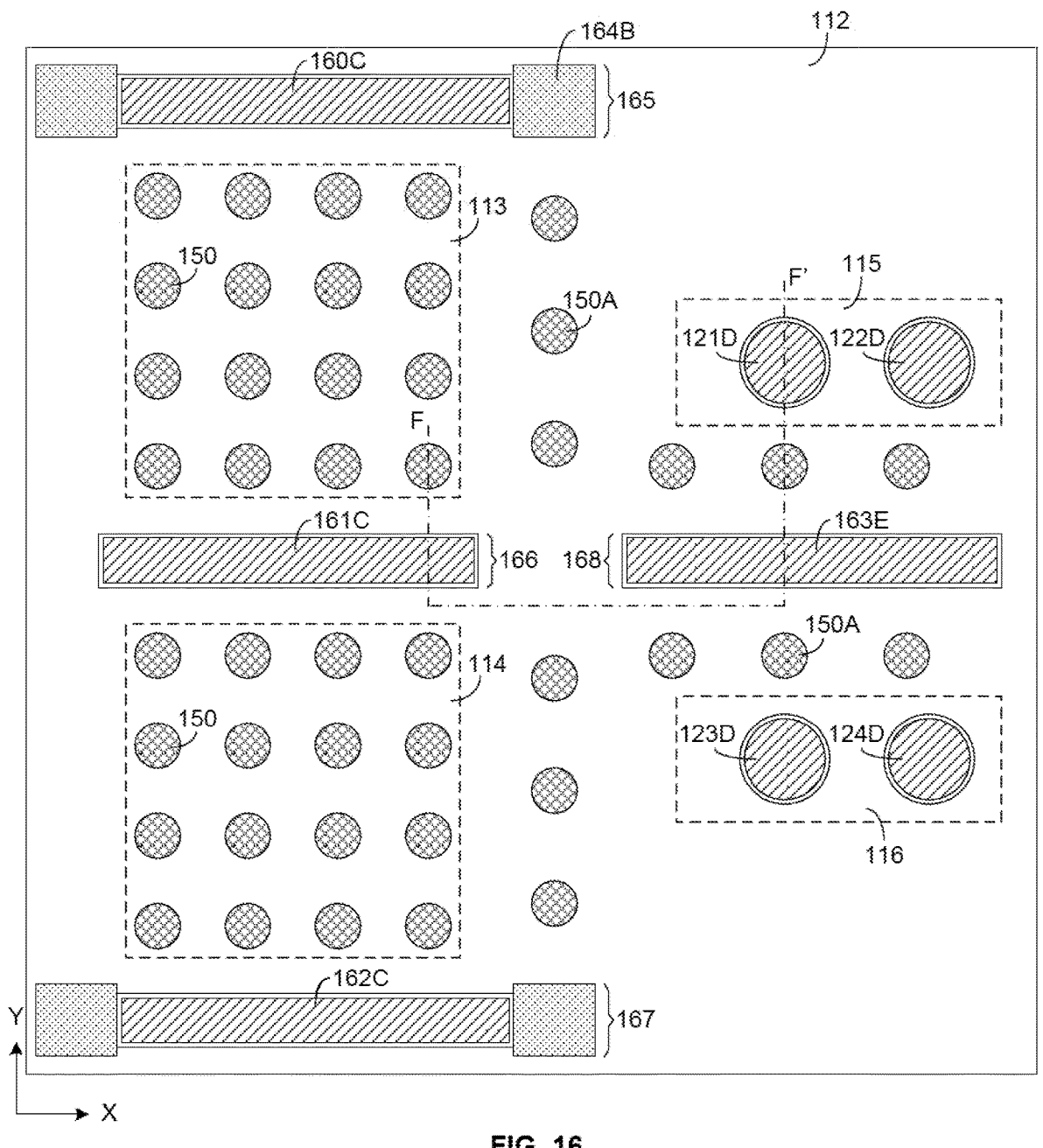
FIGS. 16 and 17 illustrate a top view and a cross-sectional view of the 3D array device shown in FIGS. 14 and 15 at a certain stage according to various aspects of the present disclosure.
Figure 17:
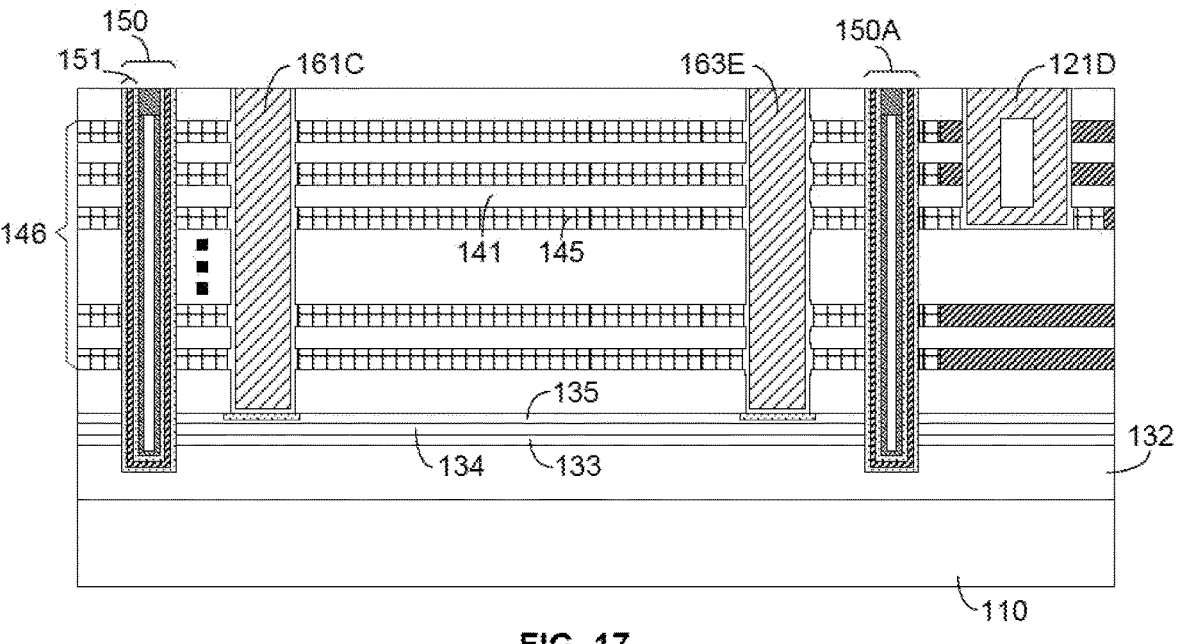

FIGS. 16 and 17 show a schematic top view and a schematic cross-sectional view of the structure of the 3D array device 100 at a certain stage according to aspects of the present disclosure. The cross-sectional view shown in FIG. 17 is taken along a line FF' of FIG. 16. After the conductive layers 145 are grown in the cavities 143, a dielectric layer (e.g., a silicon oxide layer) is deposited on sidewalls and bottom surfaces of the openings 160B-162B, 121C-124C, and 163D by CVD and/or ALD. Further, a material (e.g., undoped polysilicon) is deposited to fill these openings by CVD and/or ALD, followed by an optional chemical mechanical polishing (CMP) process. The filling process creates filling structures 160C-162C, 121D-124D, and 163E, as shown in FIGS. 16 and 17. Voids may form in certain filling structures during the filling process.

Referring to FIG. 16, GLS structures 165-168 are formed when the filling structures are made. The GLS structure 165 includes the filling structure 160C and two end blocks (e.g., the end block 164B). The GLS structure 167 includes the filling structure 162C and two end blocks. The GLS structure 166 and 168 include the filling structure 161C and 163E, respectively. As the GLS structures are made in the openings for GLS, the GLS structures have certain dimensions of the openings 160-163 with respect to FIG. 3. That is, the GLS structures 165 and 167 have a main section with a width w1 and enlarged end sections with a width w2, while the GLS structures 166 and 168 have a main section with a width w1 and without any enlarged end section. The distance between the main section of the GLS structure and the channel hole structures 150 is d1 that is smaller than d2, the closest distance between the enlarged end section of the GLS structure and a channel hole structures 150. The GLS structures 165-168 are parallel to each other in an X-Y plane, extend along the X direction, and extend through the conductor/insulator stack 146 in the Z direction. The GLS structure 166 is between the GLS structures 165 and 167. The GLS structure 166 and 168 are adjacent to each other and separated by a distance s in the X direction. In some cases, the GLS structure 166 and 168 are aligned with respect to the Y axis. Alternatively, the GLS structure 166 and 168 may not be aligned with respect to the Y axis. For example, centers of the GLS structure 166 and 168 may have a distance smaller than w1 with respect to the Y axis. The GLS structures 165-167 are adjacent to the memory cell regions 113 or 114. The GLS structure 168 is adjacent to the SCT regions 115 and 116 and is away from the memory cell regions 113 and 114.

In some aspects, the memory cell regions 113 and 114 each may represent a memory finger, and together may represent a memory block that is arranged between the GLS structures 165 and 167. The memory finger is between two GLS structures, such as between the GLS structures 165 and 166.

For the GLS structures 165 and 167, the enlarged end section is wider than the main section in the Y direction. As illustrated above, the enlarged end section (i.e., the end block) is made first. When the exposed second dielectric layers 142 are etched through the openings 160B and 162B, the enlarged end section functions as a block. Further, since the enlarged end section is wider than the main section, there may be fewer seams and voids in the enlarged end section than that in the main section. As such, certain fabrication issues may be avoided. The yield and reliability may be improved.

The GLS structures 166 and 168 are separated by a predetermined distance and fabricated respectively. If the GLS structures 166 and 168 are connected, processes performed in the region of the GLS structure 168 may affect the memory cell regions 113 and 114. Hence when the GLS structures 166 and 168 are separated, certain fabrication issues may be prevented. The yield and reliability may be improved.

Figure 18:
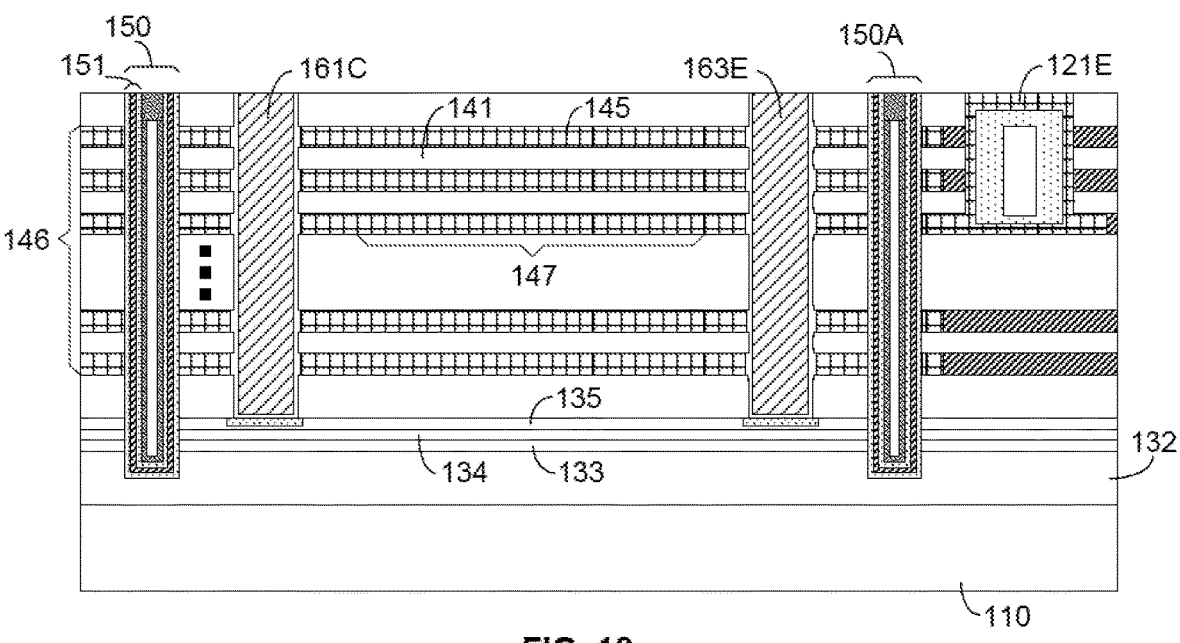
FIGS. 18 and 19 illustrate a cross-sectional view and a top view of the 3D array device shown in FIGS. 16 and 17 after SCTs are formed according to various aspects of the present disclosure.
Figure 19:
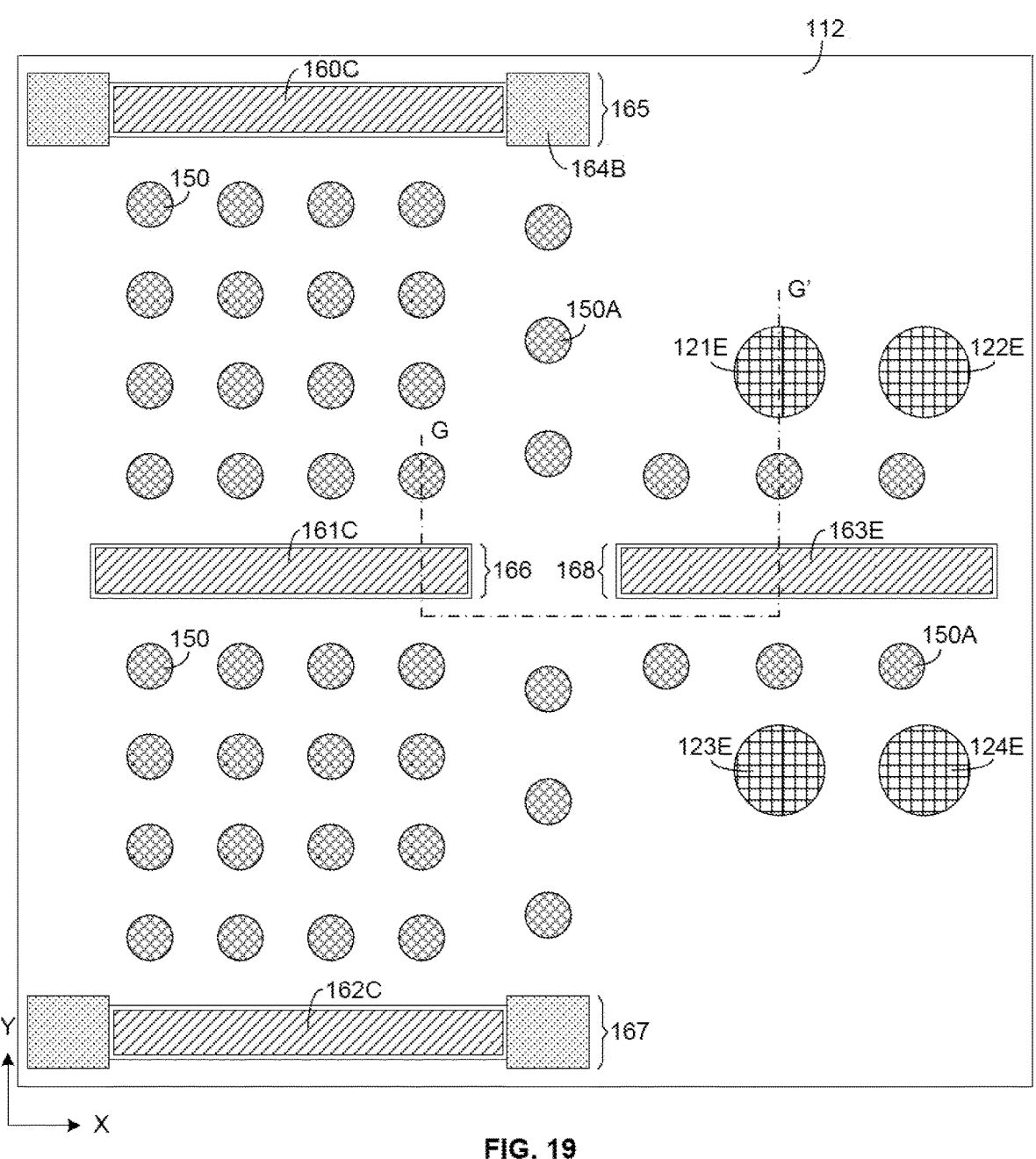

FIGS. 18 and 19 show a schematic cross-sectional view and a schematic top view of the structure of the 3D array device 100 after SCTs are made according to aspects of the present disclosure. The cross-sectional view shown in FIG. 18 is taken along a line GG' of FIG. 19. After the GLS structures are fabricated, the filling structures 121D-124D in the SCT regions 115 and 116 are etched away in a selective etch (e.g., a selective wet etch), forming openings (not shown). In some cases, the dielectric layers coated on the sidewalls are also etched in the etch or another selective etch. A conductive layer 145 is exposed at the bottom of each opening. Sides of certain first and second dielectric layer 141 and 142 are also exposed on the sidewall, if the dielectric layer is removed.

Further, a conductive material is deposited by CVD and/or ALD. The conductive material may include a metallic material such as W in some aspects. The deposition creates conductor layers on the sidewalls and bottoms of the openings. At each opening, the conductor layer electrically contacts a conductive layer 145 (i.e., word lines). Optionally, before forming the conductor layers, a conductive material such as TiN may be deposited first to grow thin layers as a contact and/or barrier layer on the sidewalls and bottoms of the openings.

After the conductor layers are formed, a dielectric material such as silicon oxide is deposited by CVD to fill the openings with dielectric filling structures. Voids may form in the dielectric filling structures in some cases. Further, a conductive material (e.g., W, Co, Cu, Al, or Ti) is deposited to form SCTs 121E-124E. CVD may be performed in some aspects. The SCTs include the conductor layers, respectively. Each SCT is electrically connected to a corresponding conductive layer 145 through a conductor layer.

As shown in FIG. 19, the GLS structure 168 is between the SCT regions 115 and 116. The SCTs 121E-124E are adjacent to the GLS structure 168. The SCTs 121E and 122E are on one side of the GLS structure 168, while the SCTs 123E and 124E are on the other side of the GLS structure 168 along the Y direction. The SCTs or SCT regions are aligned with the middle part of the memory block with respect of the Y axis. Conductive layers 145 in the SCT regions 115 and 116 are electrically connected to conductive layers 145 in the memory cell regions 113 and 114 by sections of the conductive layers 145 around the GLS structure 168, between the GLS structures 168 and the SCTs 121E-124E along the Y direction, and between the GLS structures 166 and 168. For example, a section 147 of a conductive layer 145 connects a conductive layer 145 in the memory cell regions and the SCT 121E in the SCT regions, as shown in FIG. 18.

Figure 20:
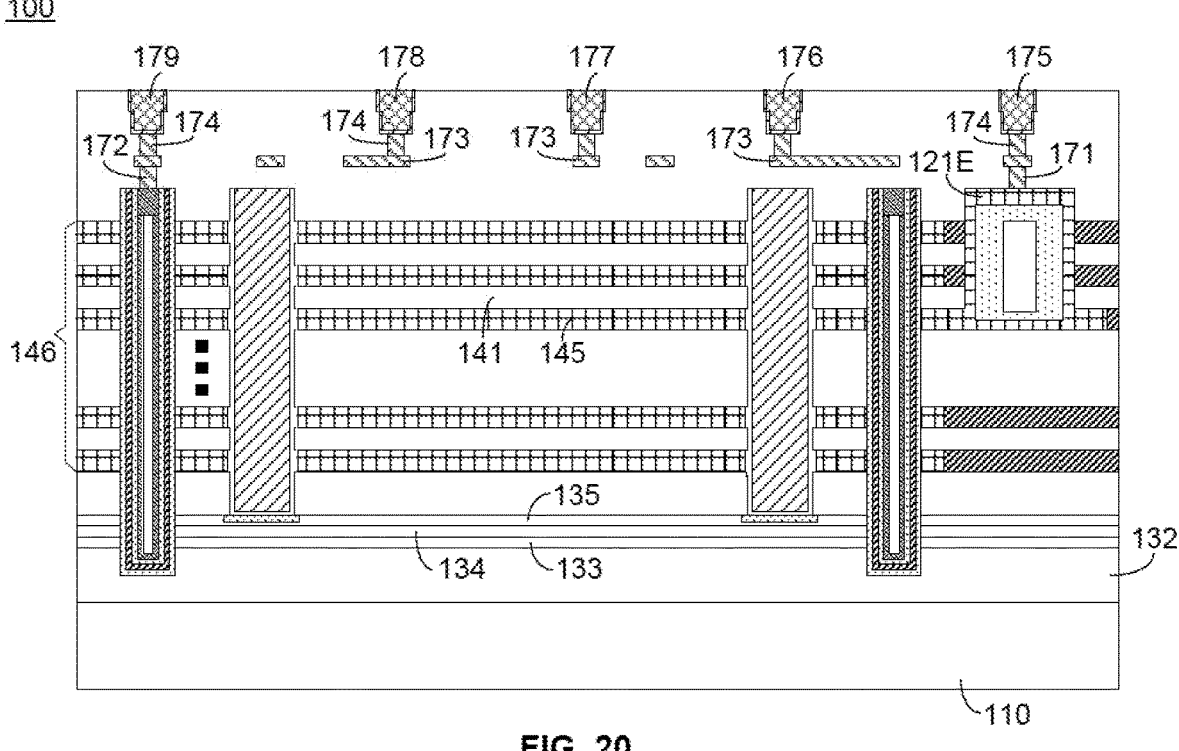
FIG. 20 illustrates a cross-sectional view of the 3D array device shown in FIGS. 18 and 19 at a certain stage in the fabrication process according to various aspects of the present disclosure.

Further, a conductive material such as W, Co, Cu, Al, or Ti is deposited to make vias such as vias 171 and 172. The vias 171 and 172 are aligned with and contact the SCT 121E and the upper end of a channel hole structure 150, respectively. Further, conductor layers (such as metal lines) 173 are deposited for interconnect, and then vias 174 and connecting pads 175-179 are made, as shown in FIG. 20. Conductive materials (e.g., W, Co, Cu, Al, Ti, or a combination thereof) and CVD and/or ALD may be used in the deposition processes. Optionally, a contact/barrier layer (e.g., TiN) may be deposited first before depositing the conductive material. The 3D array structure shown in FIG. 20 may be referred to as the 3D array device 100.

Figure 21:
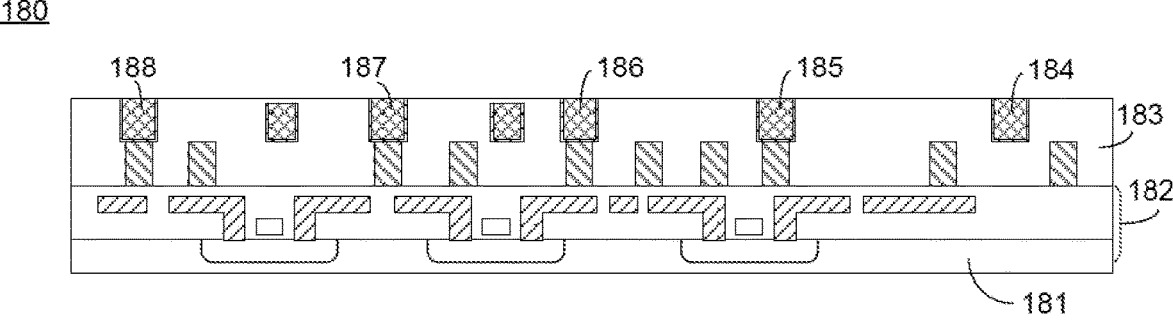
FIG. 21 illustrates a cross-sectional view of an exemplary periphery device according to various aspects of the present disclosure.

FIG. 21 shows a schematic cross-sectional view of a periphery device 180 according to aspects of the present disclosure. The periphery device 180 is a part of a 3D memory device and may also be referred to as a peripheral structure. The periphery device 180 includes a substrate 181 that may include single crystalline silicon, Ge, SiGe, SiC, SOI, GOI, polysilicon, or a Group III-V compound such as GaAs or InP. Periphery CMOS circuits 182 (e.g., control circuits) are fabricated on the substrate 181 and used for facilitating the operation of the 3D memory device. For example, the periphery CMOS circuits 182 may include metal-oxide-semiconductor field-effect transistors (MOSFETs) and provide functional devices such as page buffers, sense amplifiers, column decoders, and row decoders. A dielectric layer 183 is deposited over the substrate 181 and CMOS circuits 182. Connecting pads (such as connecting pads 184-188) and vias are formed in the dielectric layer 183. The dielectric layer 183 includes one or more dielectric materials such as silicon oxide and silicon nitride. The connecting pads 184-188 are formed to connect with the 3D array device 100 and may include a conductive material such as W, Co, Cu, Al, Ti or a combination thereof.

For the 3D array device 100 and periphery device 180, the bottom side of the substrate 110 or 181 may be referred to as the back side, and the side with the connecting pads 175-179 or 184-188 may be referred to as the front side or face side.

Figure 22:
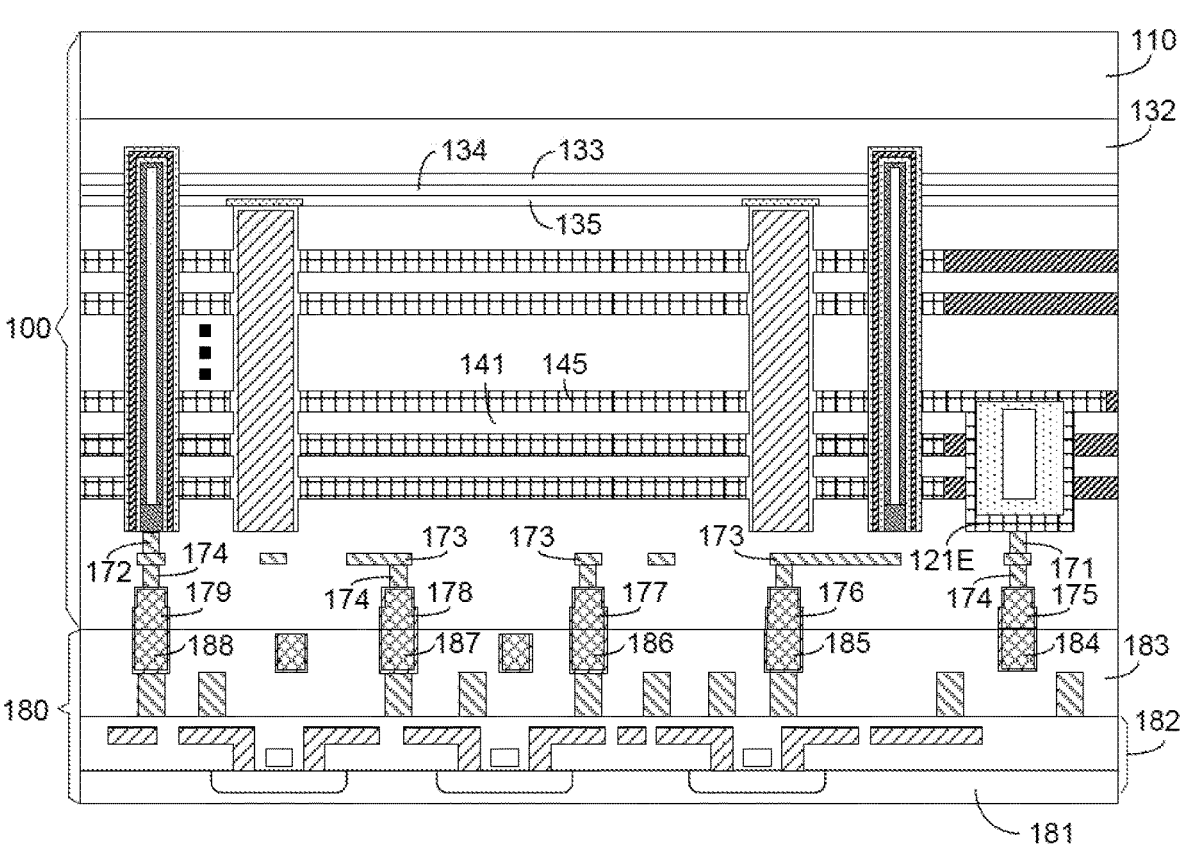
FIG. 22 illustrates a cross-sectional view of a 3D memory device after the 3D array device shown in FIG. 20 is bonded with the periphery device shown in FIG. 21 according to various aspects of the present disclosure.

FIG. 22 schematically shows a fabrication process of an exemplary 3D memory device 190 in a cross-sectional view according to aspects of the present disclosure. The 3D memory device 190 includes the 3D array device 100 shown in FIG. 20 and the periphery device 180 shown in FIG. 21. In some embodiments, the 3D array device 100 and the periphery device 180 are fabricated separately and then bonded together to form the 3D memory device 190. Alternatively, the periphery device 180 may be made first, and the 3D array device 100 may be built using the device 180 as a substrate component, forming an integrated 3D memory device.

Provided the 3D array device 100 and periphery device 180 are bonded by a flip-chip bonding method to form the 3D memory device 190, as shown in FIG. 22. In some aspects, the 3D array device 100 is flipped vertically and becomes upside down with the top surfaces of the connecting pads 175-179 facing downward. The two devices are placed together such that the 3D array device 100 is above the periphery device 180. After an alignment is made, e.g., the connecting pads 175-179 are aligned with the connecting pads 184-188, respectively, the 3D array device 100 and periphery device 180 are joined face to face and bonded together. The conductor/insulator stack 146 and the periphery CMOS circuits 182 become sandwiched between the substrates 110 and 181. In some aspects, a solder or a conductive adhesive is used to bond the connecting pads

175-179 with the connecting pads 184-188, respectively. As such, the connecting pads 175-179 are connected to the connecting pads 184-188, respectively.

Thereafter, other fabrication steps or processes are performed to complete fabrication of the 3D memory device 190. The other fabrication steps and processes are not reflected in FIG. 22 for simplicity. For example, after the flip-chip bonding, the substrate 110 of the 3D array device 100 may be removed from the bottom by a thinning process, such as wafer grinding, dry etch, wet etch, CMP, or a combination thereof. As aforementioned, the layers 132-135 may be polysilicon, silicon oxide, silicon nitride, and polysilicon, respectively. The layer 132 is exposed first and etched. After the layer 132 is removed, the layer 133 and blocking layers 152 become exposed. Then, layers 133-134 and 152-154 are etched out by certain selective etches. The layer 135 and semiconductor channel 155 are exposed. A conductive material or semiconductor material (e.g., doped polysilicon) may be deposited to form a layer that connects with semiconductor channels 155 and functions as an array common source. Further, additional fabrication steps or processes are performed. Details of the additional fabrication steps or processes are omitted for simplicity.

FIG. 23 shows a schematic flow chart 200 for fabricating a 3D memory device according to aspects of the present disclosure. At 210, a substrate is provided for fabricating a 3D array device. The substrate includes a semiconductor substrate, such as a single crystalline silicon substrate. Sacrificial layers are deposited over a top surface of the substrate. The sacrificial layers may include polysilicon, silicon oxide, and silicon nitride.

Over the sacrificial layers, a dielectric stack is fabricated. The dielectric stack includes a first stack layer and a second stack layer that are alternately stacked. The first stack layer includes a first dielectric layer and the second stack layer includes a second dielectric layer that is different than the first dielectric layer. In some aspects, one of the first and second dielectric layers is used as a sacrificial stack layer.

At 211, channel holes are formed that extend through the dielectric stack and some of the sacrificial layers. A functional layer is deposited on the sidewall and bottom of each channel hole. The functional layer includes a blocking layer, a charge trap layer, and a tunneling layer that are deposited sequentially. Thereafter, a semiconductor channel is deposited on a surface of the tunneling layer. Channel hole structures in memory cell regions are configured to make memory cells. Channel hole structures formed outside memory cell regions are dummy channel hole structures and configured for providing mechanical support when certain cavities are etched. A planarization process may be performed after the channel hole structures are made.

At 212, openings for GLS are formed by etch. Along a direction vertical to the substrate, the openings extend through the dielectric stack. In a horizontal plane, the openings are parallel to each other and extend along the same direction. Some openings have a main section and two enlarged end sections, while some other openings have a main section without any enlarged end section. For a memory block, two openings with the enlarged end sections are adjacent to the memory cell region and at the edge or boundary of the memory block, and two openings without the enlarged end section are in the middle, optionally aligned, and separated by a distance. One opening without the enlarged end section is adjacent to the memory cell regions, while the other opening without the enlarged end section is adjacent to SCT regions. The openings are filled with first filling structures in a deposition process. The filling materials at the enlarged end sections are etched away selectively and then filled with dielectric end blocks (e.g., silicon oxide end blocks).

At 213, an opening for SCT is formed in an SCT region. The opening for SCT reaches a target sacrificial stack layer at the bottom. A dielectric spacer layer is formed on the sidewall of the opening. A section of the target sacrificial stack layer is removed by a selective wet etch, creating a cavity around the bottom of the opening. A deposition process is performed to fill the cavity with a first filling layer and fill the opening with a second filling structure. With similar methods, other SCT openings are formed respectively, and cavities are etched at the bottoms after removal of target sacrificial stack layers in different depths. These openings and cavities are filled with second filling structures and first filling layers, respectively.

At 214, the first filling structure adjacent to the SCT regions is removed in a selective wet etch, exposing sides of the sacrificial stack layers on the sidewall. The exposed sacrificial stack layers are etched in a timed selective wet etch, creating cavities around the opening. A deposition process is performed to fill the cavities with second filling layers and fill the opening with a third filling structure.

At 215, the first filling structures adjacent to the memory cell regions are removed in a selective wet etch, exposing sides of the sacrificial stack layers on the sidewalls. The exposed sacrificial stack layers are etched in a selective wet etch, leaving cavities between and around the openings in the dielectric stack. Further, the second and third filling structures and first and second filling layers are removed in one or more selective wet etches. Removal of the first, second, and third filling structures creates openings for SCT and GLS. Etching of the exposed sacrificial stack layers and first and second filling layers creates cavities extending from the memory cell regions to the SCT regions in the dielectric stack. Thereafter, a deposition process is performed to fill the cavities with conductive materials (e.g., W). Conductive layers are formed in the cavities. The dielectric stack is transformed into a conductor/insulator stack.

At 216, dielectric layers are deposited on the sidewalls and bottom surfaces of the openings. The openings are then filled with dielectric materials or semiconductor materials. Some openings are filled to make first, second, and third GLS structures. A memory block is disposed between the first GLS structures that have the dielectric end blocks. The end block is wider than the main section of first GLS structure. Memory fingers of the memory block are separated by the second GLS structure that does not have dielectric end block. The first and second GLS structures are adjacent to the memory cell regions. The third GLS structure is adjacent to the SCT regions and does not have dielectric end block. The first, second, and third GLS structures are parallel to each other and extend in the same direction. The second and third GLS structures are separated by a distance, and aligned in some cases.

At 217, materials filling the openings in the SCT regions are removed by a selective wet etch, forming openings for SCT. In each opening for SCT, a conductive layer is exposed at the bottom. A conductive material such as W is deposited inside the openings for SCT. Conductor layers are grown on the sidewalls and bottoms. Each conductor layer contacts and connects with a corresponding conductive layer (i.e., a word line). The openings are then filled with a dielectric material and conductive top parts that connect to the conductor layers, respectively. The SCTs are formed as the contacts for word lines. The conductive top part may contain a conductive material such as W, Co, Cu, Al, or Ti.

Further, vias, conductor layers such as metal lines, and connecting pads are formed for interconnect. The vias, metal lines, and connecting pads may contain a conductive material such as W, Co, Cu, Al, or Ti.

At 218, a 3D memory device is fabricated. In some aspects, a flip-chip bonding process is performed to bond the 3D array device and a periphery device to create the 3D memory device. In some other cases, a periphery device is made first. Thereafter, the 3D array device is formed over the periphery device, creating an integrated 3D memory device. Referring to the former scenario, the 3D array device is flipped upside down and positioned above the periphery device. The connecting pads of the 3D array device and the periphery device are aligned and then bonded. After the substrate of the 3D array device is removed, the sacrificial layers are etched. Deposition processes are performed to form vias, conductor layers, and contact pads. The contact pads are configured for wire bonding for connection with other devices.

Figure 24:
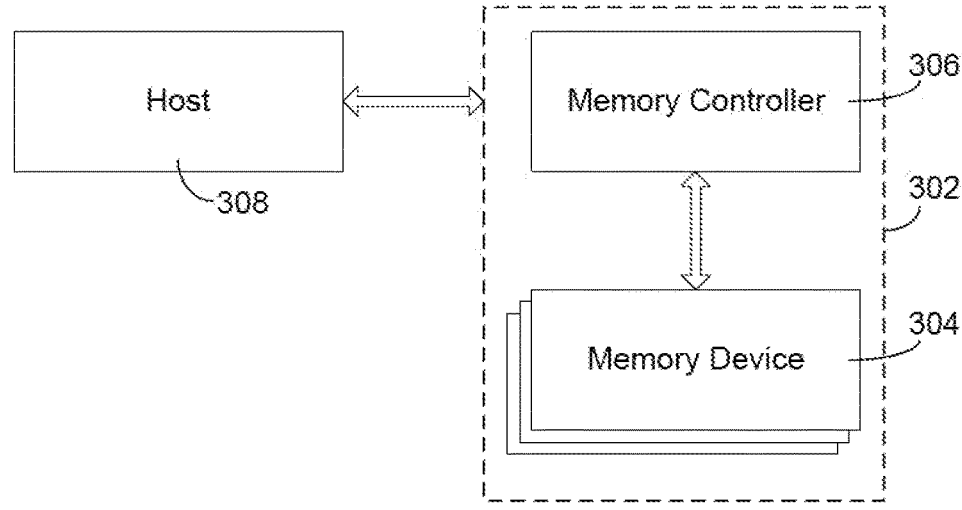
FIG. 24 illustrates a block diagram of an exemplary system having memory devices according to various embodiments of the present disclosure.

FIG. 24 shows a block diagram of an exemplary system 300 having a memory device according to various aspects of the present disclosure. The system 300 may be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 24, the system 300 may include a host 308 and a memory system 302 having one or more memory devices 304 and a memory controller 306. The host 308 may be a processor of an electronic device, such as a central processing unit (CPU), or a system-on-chip (SoC), such as an application processor (AP). The host 308 may be configured to send or receive data to or from the memory devices 304.

The memory controller 306 is coupled to the memory devices 304 and host 308 and is configured to control the memory devices 304, according to some implementations. The memory controller 306 may manage the data stored in the memory devices 304 and communicate with the host 308. In some embodiments, the memory controller 306 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some other embodiments, the memory controller 306 is designed for operating in a high duty-cycle environment, such as solid-state drives (SSDs) or embedded multi-media-cards (eMMCs) used as data storage for mobile devices, such as smartphones, tablets, laptop computers, etc., and enterprise storage arrays. The memory controller 306 may be configured to control operations of the memory device 304, such as read, erase, and program operations.

The memory controller 306 may also be configured to manage various functions with respect to the data stored or to be stored in the memory device 304 including, but not limited to bad-block management, garbage collection, logical-to-physical address conversion, wear leveling, etc. In some implementations, the memory controller 306 is further configured to process error correction codes (ECCs) with respect to the data read from or written to the memory device 304. Any other suitable functions may be performed by the memory controller 306 as well, for example, formatting the memory device 304. The memory controller 306 may communicate with an external device (e.g., the host 308) according to a particular communication protocol. For example, the memory controller 306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The memory device 304 may be any memory device disclosed in the present disclosure, such as the 3D memory device 190 shown in FIG. 22. As the 3D memory device 190 may have improved yield and reliability due to the reasons described above, when the device 190 is used, the system 300 may have a lower cost and improved reliability.

Figure 25:
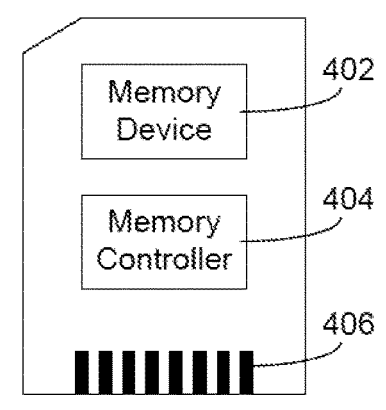
FIG. 25 illustrates a diagram of an exemplary memory card having a memory device according to various aspects of the present disclosure.
Figure 26:
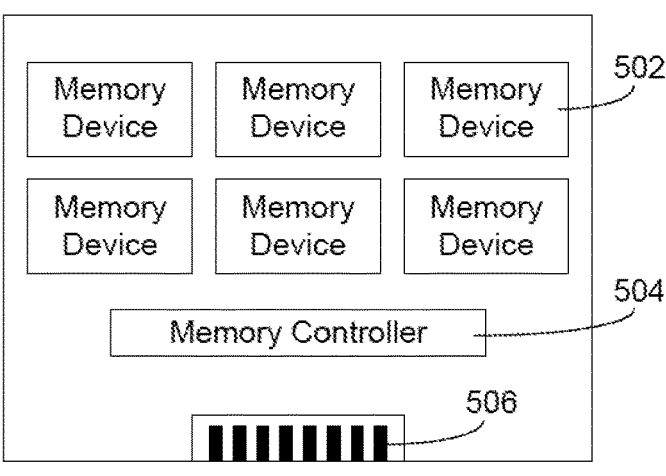
FIG. 26 illustrates a diagram of an exemplary solid-state drive (SSD) having memory devices according to various aspects of the present disclosure.

The memory controller 306 and one or more memory devices 304 may be integrated into various types of storage devices, for example, be included in the same package, such as a universal Flash storage (UFS) package or an eMMC package. That is, the memory system 302 may be implemented and packaged into different types of end electronic products. FIGS. 25 and 26 exemplarily illustrate block diagrams of a memory card 400 and an SSD 500 according to various aspects of the present disclosure. As shown in FIG. 25, a memory controller 404 and a single memory device 402 may be integrated into the memory card 400. The memory device 402 may be any memory device illustrated above, such as the 3D memory device 190 shown in FIG. 22. The memory card 400 may include a PC card (personal computer memory card international association (PCM-CIA)), a CF card, a smart media (SM) card, a memory stick, a multimedia card (MMC, RS-MMC, or MMCmicro), an SD card (SD, miniSD, microSD, or SDHC), a UFS, etc. The memory card 400 may further include a memory card connector 406 configured to couple the memory card 400 to a host (e.g., the host 308 shown in FIG. 24). As shown in FIG. 26, a memory controller 504 and multiple memory devices 502 may be integrated into the SSD 500. The memory devices 502 may be any aforementioned memory device, such as the 3D memory device 190 shown in FIG. 22. The SSD 500 may further include an SSD connector 506 configured to couple the SSD 500 to a host (e.g., the host 308 shown in FIG. 24). In some embodiments, the storage capacity and/or the operation speed of the SSD 500 is greater than those of the memory card 400.

Although the principles and implementations of the present disclosure are described by using specific aspects in the specification, the foregoing descriptions of the aspects are only intended to help understand the present disclosure. In addition, features of aforementioned different aspects may be combined to form additional aspects. A person of ordinary skill in the art may make modifications to the specific implementations and application range according to the idea of the present disclosure. Hence, the content of the specification should not be construed as a limitation to the present disclosure.

What is claimed is:

1. A three-dimensional (3D) memory device, comprising:
   a conductor/insulator stack including a conductive layer and a dielectric layer alternatingly stacked;
   a channel hole structure in a region of memory cells in the conductor/insulator stack; and
   a first gate line slit (GLS) structure adjacent to the region of memory cells and including a first main section and a first end section, the first main section extending along a first direction and having a first width measured along a second direction that is perpendicular to the first direction, the first end section having a second width measured along the second direction, and the second width of the first end section being larger than the first width of the first main section, wherein
   the first GLS structure separates the memory cells into memory blocks, and
   the first GLS structure extends in a direction from the region of memory cells to a staircase contact (SCT) region, wherein the first end section of the first GLS structure ends at a position before reaching a distant end of the SCT region.

2. The 3D memory device according to claim 1, further comprising:
   a second GLS structure; and a third GLS structure, wherein
   the second and third GLS structures are each parallel to the first GLS structure to separate the memory cells in a memory block into memory fingers, and
   the second and third GLS structures are separated by a distance in the first direction.

3. The 3D memory device according to claim 2, wherein the second GLS structure is in the region of memory cells and the third GLS structure is formed in the SCT region.

4. The 3D memory device according to claim 2, further comprising:
   a fourth GLS structure including a second main section and a second end section, the second main section extending along the first direction and having a third width measured along the second direction, the second end section having a fourth width measured along the second direction, and the fourth width of the second end section being larger than the third width of the second main section, wherein
   the fourth GLS structure defines an edge of a memory block.

5. The 3D memory device according to claim 2, wherein the first GLS structure further includes another first end section extended outside of an end of the second GLS structure.

6. The 3D memory device according to claim 1, wherein
   the SCT region includes a plurality of SCTs, the plurality of SCTs being located corresponding to a middle part of a corresponding memory block, and
   the plurality of SCTs are formed within an upper portion of the conductor/insulator stack.

7. The 3D memory device according to claim 2, wherein the SCT region includes
   a first staircase contact (SCT); and
   a second SCT, wherein the first SCT and second SCT are adjacent to the third GLS structure, and the third GLS structure is between the first SCT and second SCT in the second direction.

8. A three-dimensional (3D) memory device, comprising:
   a conductor/insulator stack including a conductive layer and a dielectric layer alternatingly stacked;
   a channel hole structure in a region of memory cells in the conductor/insulator stack;
   a first gate line slit (GLS) structure;
   a second GLS structure;
   a third GLS structure adjacent to the second GLS structure; and
   a first staircase contact (SCT) in an SCT region and adjacent to the third GLS structure,
   the first, second, and third GLS structures extending in a first direction, wherein
   the first GLS structure separates the memory cells into memory blocks, the second GLS separates the memory cells in a memory block into memory fingers, and the first GLS structure extends in a direction from the region of memory cells to a staircase contact (SCT) region, wherein the first GLS structure includes an enlarged end section that ends at a position before reaching a distant end of the SCT region.

9. The 3D memory device according to claim 8, wherein the first GLS structure further includes a first main section with a first width, the enlarged end section has a second width, and the second width of the enlarged end section is larger than the first width of the first main section.

10. The 3D memory device according to claim 8, wherein the first SCT is electrically connected with the region of memory cells by a layer of an electrically conductive material adjacent to the third GLS structure, and the layer of the electrically conductive material is between the first SCT and the third GLS structure in the second direction.

11. The 3D memory device according to claim 8, further comprising:

a second SCT in the SCT region, the third GLS structure being between the first SCT and second SCT in the second direction.

12. The 3D memory device according to claim 8, further comprising:

a fourth GLS structure including a second main section and a second end section, the second main section extending along the first direction and having a third width measured along the second direction, the second end section having a fourth width measured along the second direction, and the fourth width of the second end section being larger than the third width of the second main section, wherein the fourth GLS structure defines an edge of a memory block.

13. A system, comprising:

a memory device; and a memory controller for controlling the memory device, the memory device comprising:

a conductor/insulator stack including a conductive layer and a dielectric layer alternatingly stacked;

a channel hole structure in a region of memory cells in the conductor/insulator stack; and a first gate line slit (GLS) structure adjacent to the region of memory cells and including a first main section and a first end section, the first main section extending along a first direction and having a first width measured along a second direction that is perpendicular to the first direction, the first end section having a second width measured along the second direction, and the second width of the first end section being larger than the first width of the first main section, wherein the first GLS structure separates the memory cells into memory blocks, and the first GLS structure extends in a direction from the region of memory cells to a staircase contact (SCT) region of the memory device, wherein the first end section of the first GLS structure ends at a position before reaching a distant end of the SCT region.

14. The system according to claim 13, wherein the memory device further comprises:

a second GLS structure; and a third GLS structure, wherein the second and third GLS structures are each parallel to the first GLS structure to separate the memory cells in a memory block into memory fingers, and the second and third GLS structures are separated by a distance in the first direction.

15. The system according to claim 14, wherein the second GLS structure is in the region of memory cells and the third GLS structure is formed in the SCT region.

16. The system according to claim 14, wherein the memory device further comprises:

a fourth GLS structure including a second main section and a second end section, the second main section extending along the first direction and having a third width measured along the second direction, the second end section having a fourth width measured along the second direction, and the fourth width of the second end section being larger than the third width of the second main section, wherein the fourth GLS structure defines an edge of a memory block.

17. The system according to claim 13, wherein the SCT region includes a plurality of SCTs, the plurality of SCTs being located corresponding to a middle part of a corresponding memory block, and the plurality of SCTs are formed within an upper portion of the conductor/insulator stack.

18. The 3D memory device according to claim 13, wherein the SCT region comprises:

a first staircase contact (SCT); and a second SCT, wherein the first SCT and second SCT are adjacent to the third GLS structure, and the third GLS structure is between the first SCT and second SCT in the second direction.

19. The 3D memory device according to claim 6, further comprising a plurality of dummy channel hole structures formed between the third GLS structure and corresponding SCTs of the plurality of SCTs.

20. The 3D memory device according to claim 1, wherein the SCT region includes an SCT, the SCT including a dielectric layer enclosing a void therein and a conductive material covering the dielectric layer.

* * * * *